US011010573B2

(12) United States Patent
Araki et al.

(10) Patent No.: US 11,010,573 B2
(45) Date of Patent: May 18, 2021

(54) OPTICAL INFORMATION READER

(71) Applicant: DENSO WAVE INCORPORATED, Chita-gun (JP)

(72) Inventors: Ryosuke Araki, Chita-gun (JP); Kyosuke Ikeda, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 0 days.

(21) Appl. No.: 16/627,936

(22) PCT Filed: Jul. 2, 2018

(86) PCT No.: PCT/JP2018/025102
§ 371 (c)(1),
(2) Date: Dec. 31, 2019

(87) PCT Pub. No.: WO2019/009258
PCT Pub. Date: Jan. 10, 2019

(65) Prior Publication Data
US 2020/0167536 A1 May 28, 2020

(30) Foreign Application Priority Data

Jul. 3, 2017 (JP) .............................. JP2017-130461
Sep. 4, 2017 (JP) .............................. JP2017-169181

(51) Int. Cl.
*G06K 7/10* (2006.01)
*H04N 1/028* (2006.01)
(Continued)

(52) U.S. Cl.
CPC ..... *G06K 7/10742* (2013.01); *G06K 7/10831* (2013.01); *G06K 7/10851* (2013.01);
(Continued)

(58) Field of Classification Search
CPC . H04N 1/0285; G02B 27/021; G06K 7/10742
(Continued)

(56) References Cited

U.S. PATENT DOCUMENTS

| 4,433,346 A | 2/1984 | Stoffel et al. |
| 2003/0039411 A1 | 2/2003 | Nada |

(Continued)

FOREIGN PATENT DOCUMENTS

| JP | 2002-125095 A | 4/2002 |
| JP | 2002-199253 A | 7/2002 |

(Continued)

OTHER PUBLICATIONS

Sep. 25, 2018 International Search Report issued in International Patent Application No. PCT/JP2018/025102.

*Primary Examiner* — Allyson N Trail
(74) *Attorney, Agent, or Firm* — Oliff PLC

(57) ABSTRACT

An optical information reader includes a reflective member that reflects illumination light emitted from an illuminant toward a reading surface, and an image former ensured to present an imaging target held over the reading surface within an imaging region of an imager. The imaging region includes a first imaging region defined between the image former and the reading surface, and a second imaging region defined between the reading surface and the reflective member so as to be continuous to the first imaging region when light is internally reflected on the reading surface inside the housing. The reflective member is arranged outside the first imaging region, while the illuminant, the imager and the image former are arranged outside the second imaging region. The illuminant emits illumination light toward a reflecting surface of the reflective member in the second imaging region.

24 Claims, 27 Drawing Sheets

(51) Int. Cl.
*H04N 1/12* (2006.01)
*H04N 1/409* (2006.01)

(52) U.S. Cl.
CPC ......... *H04N 1/0285* (2013.01); *H04N 1/0289* (2013.01); *H04N 1/1235* (2013.01); *H04N 1/409* (2013.01)

(58) Field of Classification Search
USPC ..................................... 235/462.42; 358/488
See application file for complete search history.

(56) References Cited

U.S. PATENT DOCUMENTS

| | | | |
|---|---|---|---|
| 2009/0073698 A1 | 3/2009 | Tatsuno | |
| 2015/0002912 A1 | 1/2015 | Tatsuno | |
| 2016/0125213 A1 | 5/2016 | Yamamoto | |
| 2016/0286065 A1 | 9/2016 | Harada | |
| 2017/0199479 A1* | 7/2017 | Tanaka | G02B 6/0096 |
| 2017/0272717 A1* | 9/2017 | Nishizawa | H04N 9/3188 |
| 2017/0346974 A1* | 11/2017 | Nito | G03G 15/5008 |
| 2018/0218232 A1* | 8/2018 | Tokuda | H04N 1/00037 |

FOREIGN PATENT DOCUMENTS

| | | |
|---|---|---|
| JP | 2002-365439 A | 12/2002 |
| JP | 2004-022356 A | 1/2004 |
| JP | 2004-127215 A | 4/2004 |
| JP | 2004-157213 A | 6/2004 |
| JP | 2006-146328 A | 6/2006 |
| JP | 2009-277388 A | 11/2009 |
| JP | 2010-219852 A | 9/2010 |
| JP | 2012-65188 A | 3/2012 |
| JP | 2013-069484 A | 4/2013 |
| JP | 2013-84129 A | 5/2013 |
| JP | 2017-092928 A | 5/2017 |
| KR | 10-1409455 B1 | 6/2014 |

* cited by examiner

FIRST SIDE FACE

SECOND SIDE FACE

OPTICAL INFORMATION READER

CROSS-REFERENCE TO RELATED APPLICATION

This application is based on and claims the benefit of priority from earlier Japanese Patent Applications No. 2017-169181 filed on Sep. 4, 2017 and No. 2017-130461 filed on Jul. 3, 2019 the description of which are incorporated herein by reference.

BACKGROUND

Technical Field

The present invention relates to an optical information reader which optically reads information presented by a target object (medium) to be imaged or displayed.

Related Art

Recently optical information readers, which optically read information codes, such as barcodes or QR codes (trademark), shown on media to be read, have become widespread. For example, as a stationary optical information reader for use in stores and offices, there is known a stationary information code reader which is disclosed in the following PTL 1. This stationary information code reader is provided with a casing that has a top surface in which a reading surface is formed at the center portion. The casing houses an imager and other components therein. The imager is capable of capturing an external image via the reading surface. When an information code is held over the reading surface, an image of the information code is captured by the imager and the captured code image is decoded using a known decoding method.

CITATION LIST

Patent Literature

[PTL 1] JP 2014-219796 A

In particular, recently, optical information readers are required to read not only information codes but also a wide variety of pieces of optical information shown on media to be read, including, for example, reading of passports by use of an OCR function.

For example, in the case of reading passports, there is a need to save the captured images, which leads to an increasing demand for stationary optical information readers that can cope with this need.

Generally, such a stationary optical information reader is provided with a housing that has a top surface where a reading surface (reading surface), which is covered with a dustproof plate or the like, is formed. The housing houses an imager, an imaging lens, an illuminant, and the like therein. The imager is constituted by a light-receiving sensor or the like. The imaging lens determines an imaging region where an image is to be captured by the imager via the reading surface. Therefore, a part of the illumination emitted from the illuminant may be reflected by the dustproof plate and the reflected illumination as optical noise may be included in the captured image. Similarly, a part of the illumination emitted from the illuminant may be reflected by the medium to be read held over the reading surface and the reflected illumination as optical noise may be included in the captured image.

The stationary information code reader disclosed in PTL 1 captures an image for decoding an information code therefrom. Therefore, the optical noise, if included in the captured image, has a low probability of affecting the result of decoding. However, if the captured image is to be saved, there arises a first issue that a clear image cannot be captured due to the optical noise caused by reflection from the dustproof plate or the like.

To read a wide variety of types of optical information as mentioned above, there is a need to provide several reading modes suitable for the pieces of optical information. Furthermore, there is also a need to provide an operation part for switching reading modes, a display for displaying the switched reading mode or the result of reading, or other components.

The operation part, the display, and other components are required to be provided to the top surface of the housing that forms the outer body of the optical information reader to ensure operability of the operation part or visibility of the display. However, the top surface of the housing is usually provided with a reading surface to ensure reading efficiency. Therefore, simply providing a reading surface, an operation part and a display on the top surface of the housing leads to size increase of the housing. If the housing is downsized to solve this issue, there arises a second issue that a large size medium to be read, such as a passport, is difficult to hold over the reader.

SUMMARY

Thus it is desired to solve the issues set forth above and has a first object to provide a configuration capable of preventing a captured image from being affected by optical noise due to reflection of illumination light even when an illuminant is housed in the housing.

It is also desired to have a second object to provide a configuration capable of reducing the size of the housing, while allowing a medium to be read (termed "reading target medium" hereinafter) to be easily held over the reading surface.

It is also desired to have a third object, in addition to the first object, to provide a configuration capable of reducing the size of the housing, while allowing a reading target medium to be easily held over the reading surface.

Solution to Problem

To achieve the first object, a first aspect of the disclosure is an optical information reader including:
a housing provided with a reading surface;
an illuminant arranged inside the housing;
a reflective member reflecting illumination light emitted from the illuminant toward the reading surface;
an imager arranged inside the housing; and
an image former configured to present an imaging target held over the reading surface within an imaging region of the imager, wherein
the imaging region includes a first imaging region and a second imaging region, the first imaging region being defined between the image former and the reading surface, the second imaging region being defined between the reading surface and the reflective member so as to be continuous to the first imaging region when light is internally reflected on the reading surface inside the housing;
the reflective member is arranged at a position outside the first imaging region;

the illuminant, the imager and the image former are arranged at positions outside the second imaging region; and the illuminant emits the illumination light toward a predetermined reflecting surface of the reflective member in the second imaging region.

Advantageous Effects of the First Aspect

The optical information reader according to the first aspect of the disclosure has a basic configuration including a reflective member that reflects illumination light from an illuminant to a reading surface, and an image former that is configured to present an imaging target held over the reading surface within an imaging region of the imager. The imaging region includes a first imaging region defined between the image former and the reading surface, and a second imaging region defined between the reading surface and the reflective member so as to be continuous to the first imaging region when light is internally reflected by the reading surface inside the housing. The reflecting member is arranged outside the first imaging region, while the illuminant, the imager and the image former are arranged outside the second imaging region. Illumination light is emitted from the illuminant to a predetermined reflecting surface of the reflective member in the second imaging region.

When capturing an image of an imaging target held over the reading surface, if the captured image includes an image of an internal part of the housing that is positionally inner relative to the reading surface, an image of the entire predetermined reflecting surface of the reflective member irradiated with the illumination light can be easily captured. Therefore, compared to the case where an image of the illuminant is directly captured, the illumination light is made unnoticeable and the occurrence of optical noise due to the illumination light can be minimized, while illuminance required for the captured image is ensured. Thus, in the case of housing the illuminant inside the housing, the captured image is prevented from being affected by the optical noise caused by reflection of illumination light.

According to a preferred example of this basic configuration, illumination light is emitted from an illuminant so that variation in illumination distribution on a predetermined reflecting surface is minimized. Therefore, uniform illumination distribution is easily obtained on the predetermined reflecting surface, while making the illumination light unnoticeable in the captured image. Thus, the captured image is reliably prevented from being affected by the optical noise caused by reflection of illumination light.

According to a preferred example, the reading surface is open as a reading surface, and an optically transparent plate is arranged so as to close at least a part of the reading surface. Thus, when capturing an image of an imaging target placed on the protective plate so as to be held over the reading surface (reading surface), the captured image may include an image of an internal part of the housing that is positionally inner than the protective plate. However, an image of the entire reflecting surface of the reflective member irradiated with the illumination light can be easily captured. Therefore, compared to the case of directly capturing an image of the illuminant, the illumination light can be made unnoticeable in the captured image while required illuminance is ensured. Thus, generation of optical noise due to the illumination light can be minimized. Accordingly, in the case of using an optically transparent plate, such as a dustproof plate, closing the reading surface, the captured image is prevented from being affected by the optical noise due to reflection of the illumination light.

In particular, according to a basic configuration of the optical information reader of the first aspect, the reader may include an externally operable operation part, and a display capable of displaying a result of reading performed by the reading part. In the reader, the housing has a top surface on which the reading surface in a rectangular shape is formed; the top surface is configured to include the reading surface and a surface portion at an end of the top surface, the surface portion being continuous to one side of the reading surface; and the operation part and the display are arranged on the surface portion at an end.

To achieve the second object, a second aspect of the disclosure is an optical information reader including:

a housing having a top surface on which a rectangular reading surface is formed;

an imager arranged inside the housing to capture an image of a target surface of a reading target medium held over the reading surface;

a reading part reading given information on the target surface, based on a result of imaging performed by the imager;

an externally operable operation part; and a display capable of displaying a result of reading performed by the reading part, wherein the top surface is constituted by the reading surface and an end portion that is continuous to one side of the reading surface; and the operation part is arranged on the surface portion at an end.

Advantageous Effects of the Second Aspect

According to the disclosure related to the first mode, the top surface is constituted by a rectangular reading surface and an end portion that is continuous to one side of the reading surface, and an operation part and a display are arranged on the end portion. Thus, of the top surface of the housing, the portion excepting the end portion where the operation part and the display are arranged serves as the reading surface. Therefore, for example, compared to the case where an operation part and a display are arranged on a top surface of a housing with intervention of a reading surface, a larger area of the top surface of the housing can be used as the rectangular reading surface. Therefore, a square reading surface with a necessary size can be ensured and thus a reading target medium can be easily held over the reading surface, while the size of the housing can be reduced. In particular, of the four sides of the reading surface, the side, which faces the side that is continuous to the end portion, corresponds to an edge of the top surface of the housing. Therefore, when a reading target as a reading target medium is one of two facing pages showing given information, positional displacement of the target surface of the reading target medium relative to the reading surface is minimized and the target surface is unlikely to be placed over the end portion, by placing the target surface over the reading surface such that the boundary between the two facing pages is aligned parallel to the edge of the top surface. Thus, while reading efficiency is ensured, operability of the operation part and visibility of the display are also ensured.

As a preferred mode, the reading target medium is a passport, and the reading surface is formed with a size matching that of the target surface of the passport. Thus, the form of the target surface of the passport showing given information to be read, i.e., one of the two facing pages, matches the form of the reading surface. Thus, by placing the target surface of the passport over the reading surface such that the boundary is aligned parallel to the edge of the top surface, the target surface covers only the reading surface and no longer covers the end portion. Therefore, while reading efficiency for the passport is ensured, operability of the operation part and visibility of the target surface are also reliably ensured.

DESCRIPTION OF EMBODIMENTS

First Embodiment

Figure 1:
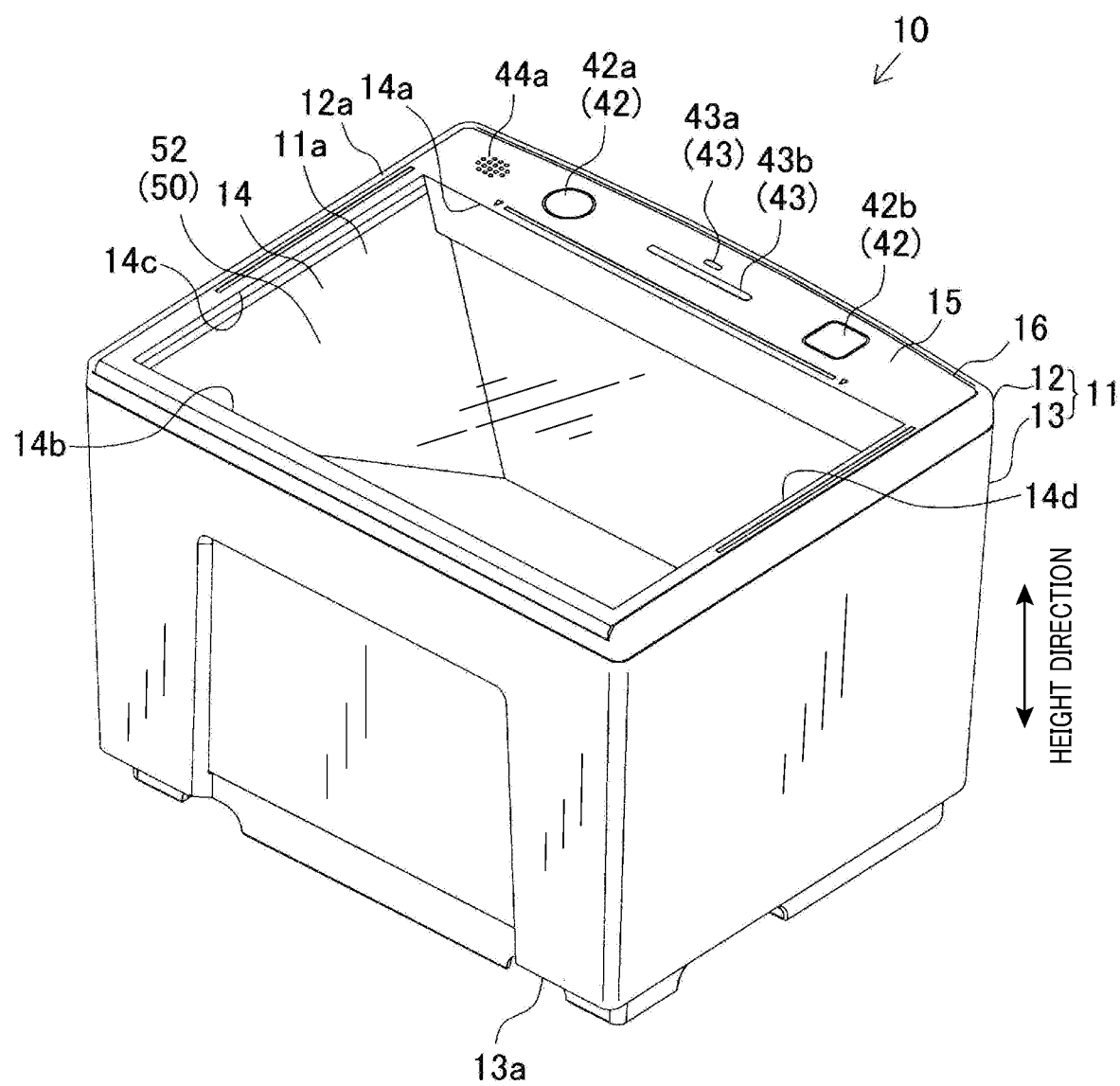
FIG. 1 is a perspective view illustrating an optical information reader according to a first embodiment.

Referring to the drawings, an optical information reader according to a first embodiment of the present invention will be described.

Figure 2:
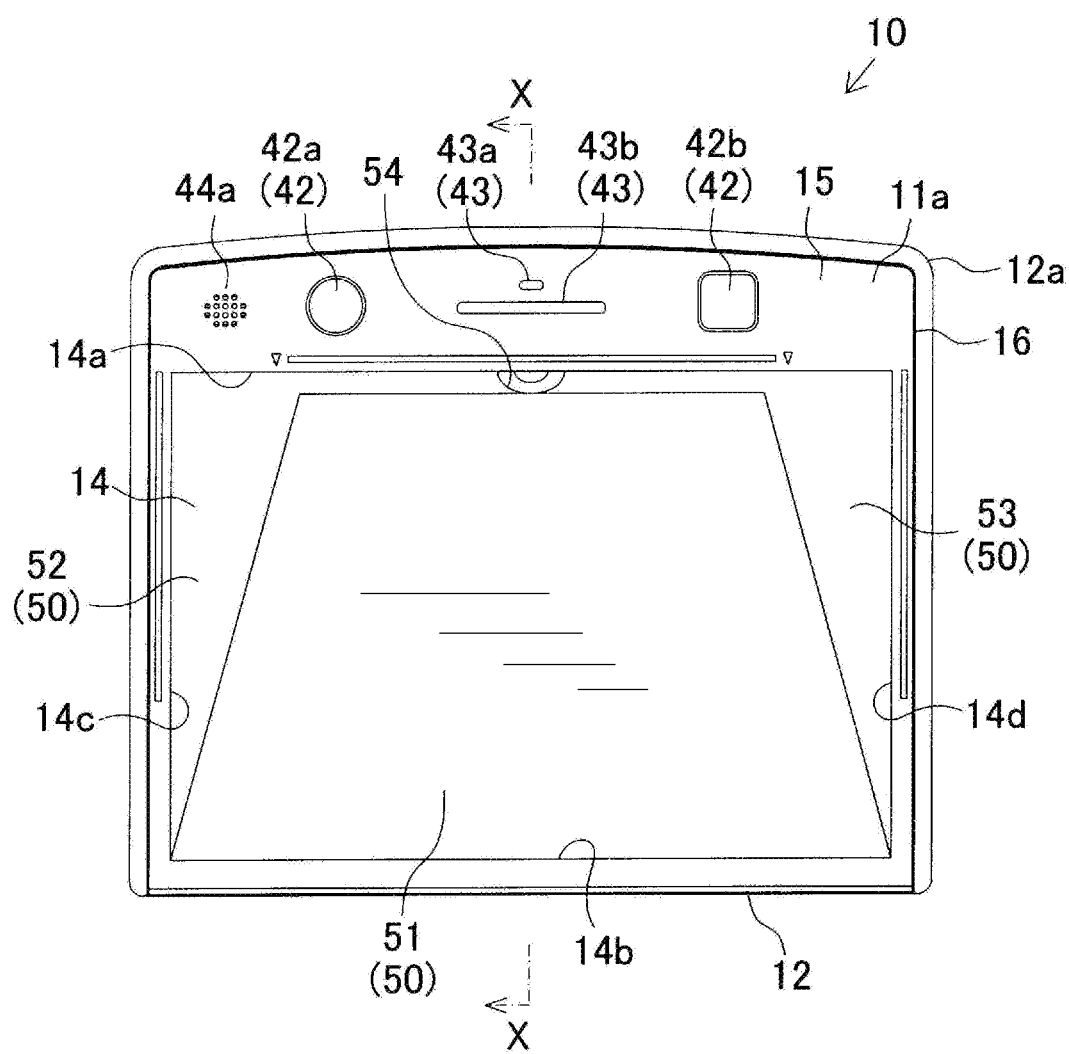
FIG. 2 is a plan view illustrating the optical information reader of FIG. 1.

FIGS. 1, 2 and some other figures show an optical information reader 10 that is a stationary reader placed on top of a desk, shelf or the like as an installation surface. The optical information reader 10 is ensured to optically read target information (optical information), such as an information code or character information, presented on a captured image of an imaging target. In addition to this, the optical information reader 10 is constituted as a captured image storage device that is capable of storing a captured image of an imaging target. In the present embodiment, an imaging target refers to a reading target medium having a target surface on which target information, such as predetermined character information or an information code, is presented using a specific character format. Accordingly, the optical information reader 10 is ensured to have an optical reading function (optical information reading means) for imaged optical information, including a known symbol recognition function (OCR) of recognizing imaged character information or the like, a function as an information code reader of reading an imaged information code, or other functions.

Figure 7:
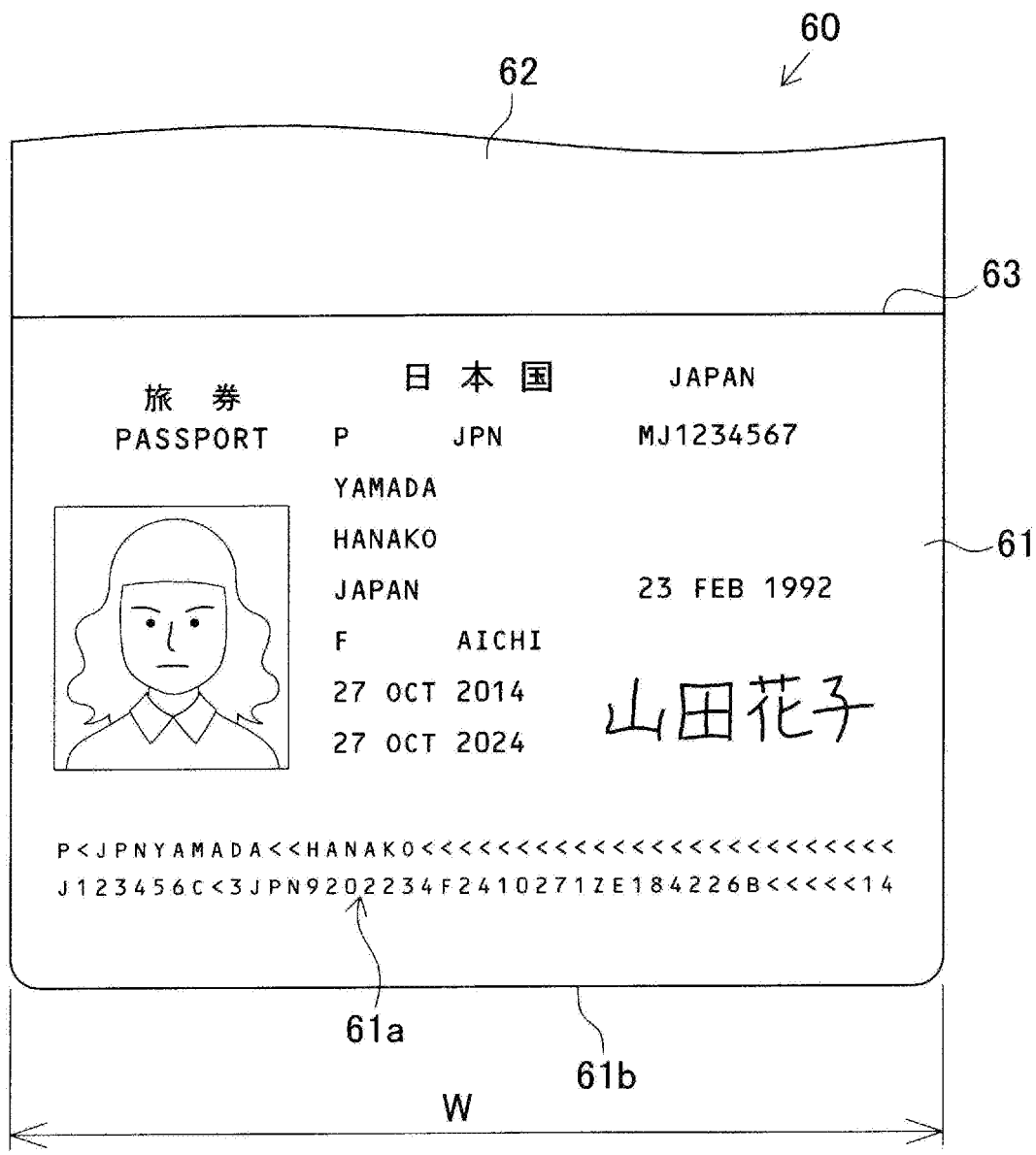
FIG. 7 is a diagram illustrating information on a target surface of a passport.

The present embodiment uses as an example a passport 60 shown in FIG. 7, for example, as a reading target medium (imaging target or reading target) where given information or the like is presented on a target surface using a specific character format. As shown in FIG. 7, the passport 60 is constituted such that one of two facing pages serves as an identity information page showing a face photo, according to Doc9303 standard issued by International Civil Aviation Organization (ICAO) (this page may also be termed "target surface 61" hereinafter). This target surface 61 has a predetermined region at the bottom where passport information 61a is presented using a specific character format.

If the optical information reader 10 serves as a captured image storage device, the captured image of the target surface 61 is subjected to image storage processing for storing the captured image. It should be noted that the information code is assumed to be a known code which is constituted by arraying several types of cells. Examples of such a code may include one-dimensional codes such as barcodes and two-dimensional codes such as QR codes (trademark). Accordingly, the present embodiment has been prepared so that mode can be switched between at least three modes which are a passport reading mode for capturing an image of the target surface 61 of the passport 60 to recognize the passport information 61a; an information code reading mode for optically reading an information code; and a license reading mode for capturing an image of a driver's license or the like, which does not require character recognition, and storing the captured image.

The optical information reader 10 includes a housing 11 made of a resin, e.g., ABS resin, forming an outer body of the optical information reader 10. As shown in FIG. 1 and some other figures, the housing 11 includes an upper casing 12 and a lower casing 13. The upper and lower casings 12 and 13 are vertically assembled to form substantially a box shape as a whole. The housing 11 houses therein an illuminant 21, an image former 27, an imager 23, a reflective member 50, and other components described later.

As shown in FIG. 2, the housing 11 has a top surface 11a where a reading surface 14 serving as an optical reading window is rectangularly opened to allow light to enter/exit therethrough. Specifically, light is ensured to enter the housing from outside via the reading surface (optical reading window) 14, while light inside the housing is ensured to exit to the outside via the reading surface 14. The image former 27 and the imager 23 form an optical system which has a function of capturing an image of a reading target medium held over the reading surface 14 (reading surface).

The top surface 11a of the housing 11 is constituted by the reading surface 14 and a band-shaped end portion 15 that is continuous to a side (or edge) 14a of the reading surface 14. The top surface 11a is protected by a protective plate 16, with the reading surface being closed thereby. The protective plate 16 is formed into a flat plate shape having a predetermined thickness. Specifically, the protective plate 16 is formed of a plate having optical transparency (e.g., made of a transparent acrylic resin, transparent glass, or the like) so that light from outside or inside the housing can be transmitted therethrough. On the end portion 15, an operation part 42, a display 43, and other parts described later are arranged.

Of the four sides (or edges) forming the reading surface 14, a side 14b facing the side 14a corresponds in their planer positions to an edge of the top surface 11a of the housing 11. Of the four sides of the reading surface 14, two other sides 14c and 14d respectively correspond in their planar positions to other edges of the top surface 11a of the housing 11. Accordingly, as shown in FIG. 2, the top surface 11a is formed such that the three edges, excepting the end portion 15, surrounding the reading surface 14 will each have a width substantially equal to the thickness of a square ring-shaped body 12a of the upper casing 12. Specifically, the top surface 11a is formed such that the edges along respective sides 14b to 14d will each have a width smaller than that of the end portion 15.

Figure 8:
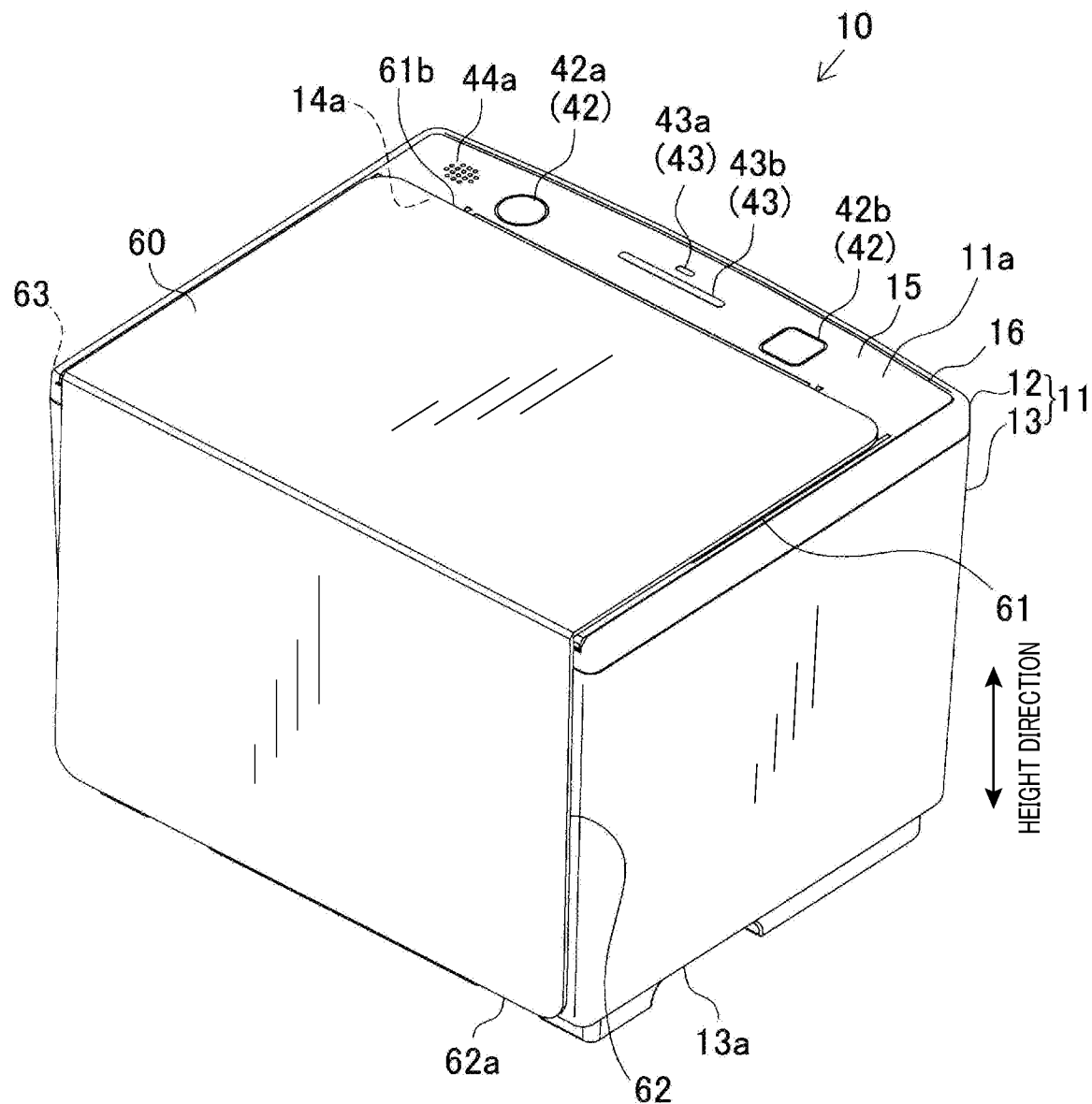
FIG. 8 is a perspective view illustrating a state in which a target surface of a passport is placed over a reading surface so as to be in contact therewith.

The reading surface (a reading window) 14 is formed so as to be suitable for the target surface 61 of the passport 60. Specifically, the reading surface 14 is formed such that the distance between the two sides 14c and 14d substantially matches a width W of the target surface 61 (see FIG. 7). The passport 60 has a boundary 63 (see FIG. 7) between the target surface 61, as a first page of the two facing pages, and a second surface 62 as a second page of the two facing pages. As shown in FIG. 8, the reading surface 14 is formed such that a lower edge 61b of the target surface 61 of the passport 60 is substantially aligned parallel to the side 14a, when the target surface 61 is placed over the surface 14 so as to face and contact therewith, with the boundary being aligned parallel to an edge of the top surface 11a.

The lower casing 13 has a height which is determined so as to be suitable for the reading of the passport 60. Specifically, the lower casing 13 has a bottom surface 13a which is provided with a plurality of legs that contact an installation surface on which the reader is placed. As shown in FIG. 8, the lower casing 13 is formed such that an edge 62a of the second surface 62 reaches the bottom surface 13a but does not reach the installation surface, when the target surface 61 is placed over the surface 14 so as to face and contact therewith, with the boundary being aligned parallel to an edge of the top surface 11a.

Figure 6:
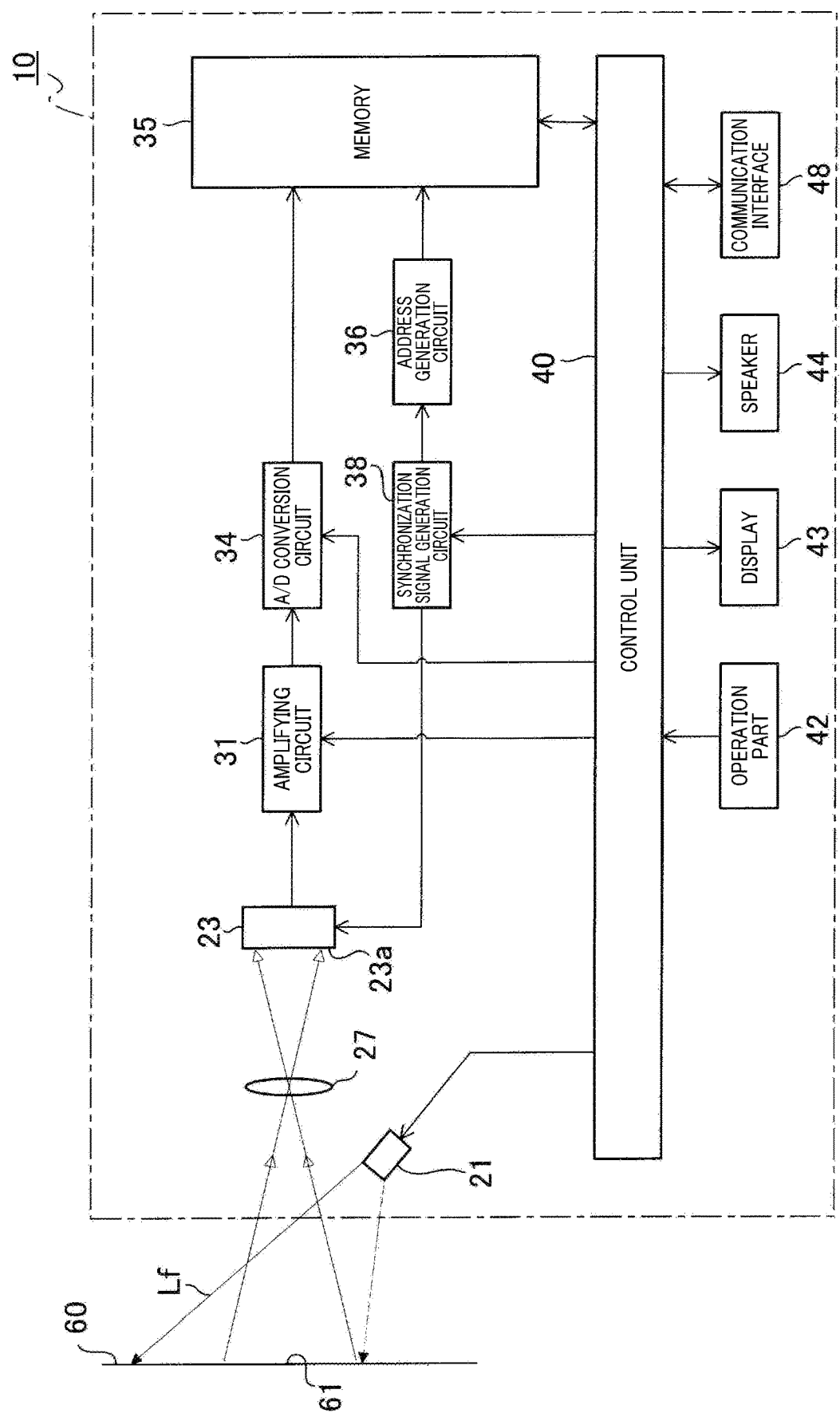
FIG. 6 is a schematic block diagram illustrating an electrical configuration of the information reader of FIG. 1.

The following description explains an electrical configuration of the optical information reader 10. As shown in FIG. 6, the optical information reader 10 mainly includes an optical system including an illuminant 21, an image former 27 and an imager 23, a microcomputer system including a memory 35 and a control unit 40, and a power supply system including a power supply part and a power supply switch neither of which are shown.

The optical system includes a projection optical system and a light-receiving optical system. The illuminant 21 configuring the projection optical system serves as a surface illuminant capable of emitting uniform illumination light Lf. The illuminant 21 is disposed below the end portion 15 and is ensured to emit illumination light Lf toward a reflecting surface 55 (described later) of the reflective member 50. Thus, use of the surface illuminant as the illuminant 21 can minimize variation in illumination distribution on the reflective member 50 to which the illumination light Lf is emitted.

Figure 3:
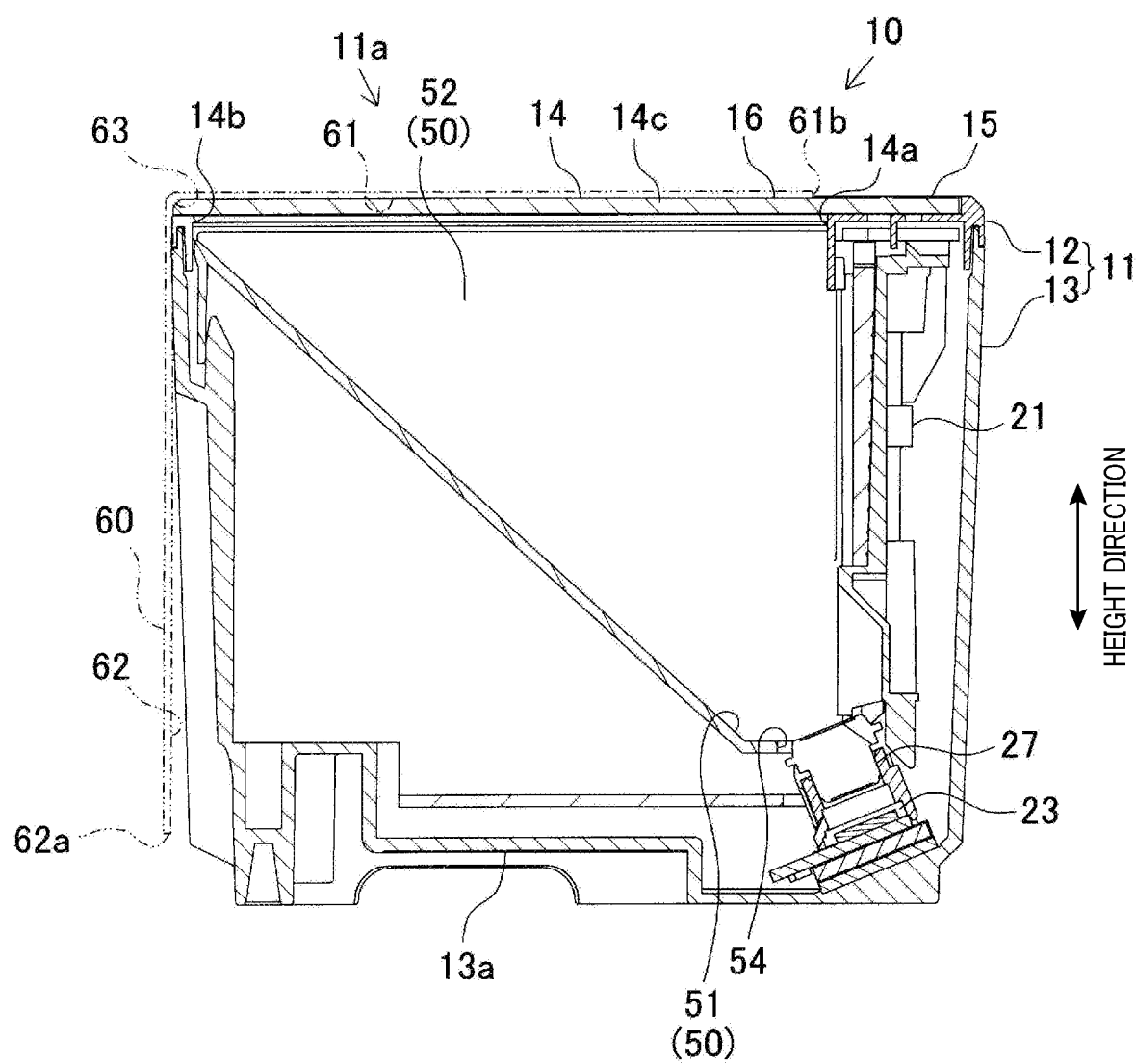
FIG. 3 is a schematic cross-sectional view taken along the line X-X of FIG. 2 illustrating the optical information reader.

As shown in FIGS. 1 to 5, the projection optical system includes the reflective member 50 that reflects and guides the light emitted from the illuminant 21. The reflective member 50 is disposed at a position to which the illumination light Lf emitted from the illuminant 21 is applied, i.e., at a position outside a first imaging region AR1 described later. Thus, the illumination light Lf from the illuminant 21 is ensured to be guided to the outside of the housing 11 via the reading surface 14. The reflective member 50 includes a first reflector 51, a second reflector 52 and a third reflector 53. As shown in FIG. 3, the first reflector 51 is formed into a flat shape, with an upper end thereof being continuous to the side 14b of the reading surface 14. Also, the second and third reflectors 52 and 53 are formed into flat shapes, with upper ends thereof being respectively continuous to the sides 14c and 14d of the reading surface 14. The first reflector 51 has a lower end at which an opening 51 is formed to have the image former 27 exposed therefrom. In FIG. 6, the reflective member 50 is omitted for the sake of ease of explanation.

As shown in FIGS. 3 and 6, the light-receiving optical system includes the image former 23, the image former 27, and other components. The image former 23 is constituted as an imaging means which is constituted by a light-receiving sensor (area sensor) where solid-state imaging devices (light-receiving devices), such as CCD devices or CMOS devices, are two-dimensionally arrayed, and other components. The image former 23 includes a light-receiving surface 23a at a position facing the image former 27 to receive light from outside the housing. The imager 23 is mounted to a substrate so as to receive light that has entered the light-receiving system via the reading surface (reading surface) 14, passed through the image former 27 and is incident on the light-receiving surface 23a.

The image former 27 is constituted by a known image forming lens to serve as an image forming optical system. The image former 27 is ensured to determine an imaging region where an image can be captured by the imager 23, and to guide light that has entered the light-receiving system from outside the housing 11 via the reading surface 14 to the light-receiving surface 23a of the imager 23. The image former 27 is arranged so as to present an imaging target, e.g., the target surface 61 of a passport 60, held over the reading surface 14 within the imaging region.

The image former 27 is ensured to form an image of an imaging target on the light-receiving surface 23a of the imager 23 when the imaging target is located within the imaging region on the outside of the housing 11. In the present configuration, the illumination light Lf is emitted from the illuminant 21 and guided to the outside of the housing by the reflective member 50. Thus, an image of the imaging target is ensured to be captured while the illumination light Lf is applied to the target. The image former 27 is ensured to collect reflected light from an imaging target when the imaging target is located within the imaging region, and to form an image of the imaging target on the light-receiving surface 23a of the imager 23.

Figure 4:
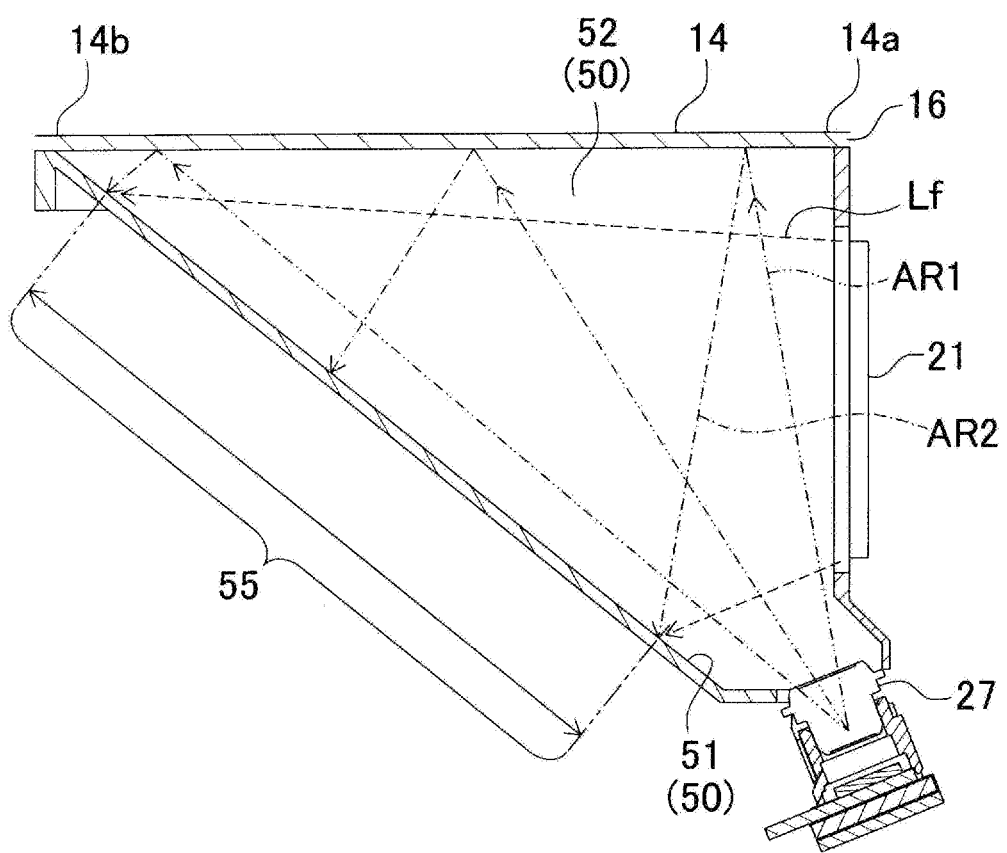
FIG. 4 is a diagram illustrating a first imaging region and a second imaging region related to the X-X cross section.
Figure 5:
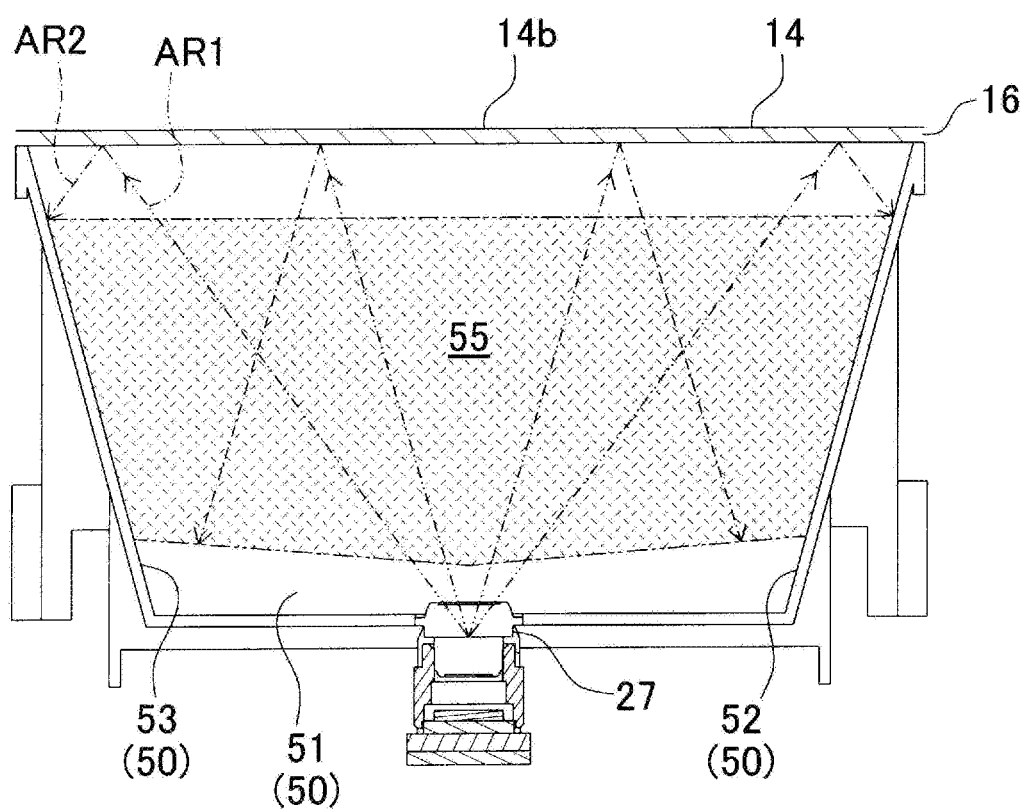
FIG. 5 is a diagram illustrating the first and second imaging regions as viewed from an illuminant.

In particular, as shown in FIGS. 4 and 5, the imaging region of the present embodiment includes a first imaging region AR1 and a second imaging region AR2. The first imaging region AR1 is defined between the image former 27 and the reading surface 14. The second imaging region AR2 is defined between the reading surface 14 and the reflective member 50 so as to be continuous to the first imaging region AR1 when light is reflected inside the housing such as by the protective plate 16 at the reading surface 14. In this case, the image former 27 is arranged such that the reflectors 51 to 53 will be located outside the first imaging region AR1. In other words, the reflective member 50 is arranged at a position outside the first imaging region AR1. The illuminant 21, the imager 23 and the image former 27 are arranged at positions outside the second imaging region AR2 to prevent them from being included in the captured image.

To prevent the illumination light Lf from being included in the captured image, the illuminant 21 is arranged such that the illumination light Lf will be applied to a predetermined reflecting surface (also termed "reflecting surface 55" hereinafter), corresponding to the second imaging region AR2, among the reflectors 51 to 53 and that illumination distribution on the reflecting surface 55 will be substantially uniform. In FIG. 5, the reflecting surface 55 is hatched for the sake of ease of understanding.

The microcomputer system includes an amplifying circuit 31, an A/D conversion circuit 34, a memory 35, an address generation circuit 36, a synchronization signal generation circuit 38 and a control unit 40, and is ensured, for example, to process an image signal relating to an image captured by the optical system described above. Specifically, the microcomputer system is ensured to store data of an image in the memory 35. This image is an image of information or the like presented in the imaging region and captured by the imager 23. The control unit 40 is ensured to analyze the image data of the presented information or the like and to recognize the information using an OCR technique if the information is character information.

If an image of an information code presented in the imaging region is captured by the imager 23, the control unit 40 is ensured to serve as an information code reading means which optically reads the information code through analysis of the code image. In other words, the control unit 40 serves as a reading part which reads information on the target surface, based on the result of imaging performed by the imager 23.

As shown in FIG. 6, the control unit 40 is connected to an operation part 42, a display 43, a speaker 44, a communication interface 48, and the like. The operation part 42, which is in the form of a touch switch, is provided to the end portion 15 so as to be externally operated. The operation part 42 includes a mode switch 42a and a scan switch 42b and is ensured to send an operation signal to the control unit 40 in response to operation of a user. The control unit 40, when it has received an operation signal from the operation part 42, is ensured to operate according to the operation signal.

The mode switch 42a serves as a switch operated when modes are switched between a passport reading mode, the information code reading mode and the license reading mode mentioned above, and other modes. The scan switch 42b serves as a switch operated when reading is started in the switched mode. It should be noted that, for example, when a reading target medium in a given format, e.g., a passport 60, is detectably held over the reading surface 14, the mode may be automatically switched to a mode suitable for the detected reading target medium without the need for operating the operation part 42, and then reading may be automatically started.

The display 43 includes a mode display LED 43a and a reading confirmation display LED 43b which are provided to the end portion 15. These display LEDs 43a and 43b are arranged between the mode switch 42a and the scan switch 42b, with the latter being in a shape longer than that of the former. The display 43, which is controlled by the control unit 40, is constituted such that the mode display LED 43a is lit up for making the switched mode recognizable and that the reading confirmation display LED 43b is lit up for helping confirmation of the result of reading confirmable.

Specifically, for example, the mode display LED 43a is lit up in green when the mode has been switched to the passport reading mode, lit up in red when mode has been switched to the information code reading mode, and lit up in blue when mode has been switched to the license reading mode to thereby serve as a display that can display the switched mode. Also, for example, the reading confirmation display LED 43b is lit up in green when the optical information reader is in a state in which it can perform reading or imaging, lit up in blue when reading has been successful, and lit in red when reading has been unsuccessful to thereby serve as a display that can indicate the result of reading performed by the reading part.

The speaker 44 is constituted as a sound part by a known speaker or the like and is ensured to emit various notification sounds, such as a preset voice or an alarm sound, via a sound outlet 44a provided to the end portion 15, according to an operation signal sent from the control unit 40. It should be noted that the protective plate 16 may be formed so as to expose the sound outlet 44a.

The communication interface 48 is constituted as an interface that performs data communication with an external device and thus performs communication processing in cooperation with the control unit 40.

For example, when the passport 60 is read using the optical information reader 10 constituted in this way, the mode switch 42a is operated to switch mode to the passport reading mode, and then, as shown in FIG. 8, the scan switch 42b is operated in a state in which the target surface 61 is held over the reading surface 14 for contact therewith, with the boundary 63 being aligned parallel to an edge (14b) of the top surface 11a. Thus, an image of the target surface 61 is captured in a state in which the target surface 61 is irradiated with the illumination light Lf of the illuminant 21 reflected on the reflective member 50. In this way, the passport information 61a or the like on the target surface 61 is recognized using an OCR technique and at the same time the captured image is stored in the memory 35.

In this case, since the imaging region includes the second imaging region AR2 which is inside the housing relative to the reading surface 14 (protective plate 16) due to reflection on the protective plate 16, the captured image may faintly include an image of the reflecting surface 55 of the reflective member 50 in addition to the target surface 61. The reflecting surface 55 is irradiated with the illumination light Lf so that the illumination distribution will be substantially uniform. Therefore, the illumination light Lf can be less represented in the captured image while required illuminance is ensured, compared to the case, for example, where illumination distribution varies with inclusion of a high illuminance range of the reflecting surface 55.

Furthermore, for example, when reading an information code presented on a target surface such as a given paper form as a reading target medium, the mode switch 42a is operated to switch mode to the information code reading mode, and then the scan switch 42b is operated in a state in which the information code presented on the target surface is held over the reading surface 14. Thus, an image of the target surface is captured in a state in which the target surface is irradiated with the illumination light Lf emitted from the illuminant 21 and reflected on the reflective member 50. Then, the information code presented on the target surface is analyzed to thereby decode and read the information recorded thereon.

Furthermore, for example, when capturing an image of a target surface of a driver's license and storing the captured image, the mode switch 42a is operated to switch mode to the license reading mode, and then the scan switch 42b is operated in a state in which the target surface is held over the reading surface 14. Thus, an image of the target surface of the driver's license is captured in a state in which the target surface is irradiated with the illumination light Lf emitted from the illuminant 21 and reflected on the reflective member 50, and then the captured image is stored in the memory 35 or the like.

In this case as well, the captured image may faintly include an image of the reflecting surface 55 of the reflective member 50 in addition to the target surface of the driver's license. However, since the reflecting surface 55 is substantially evenly irradiated with the illumination light Lf, the illumination light Lf can be made unnoticeable in the captured image while required illuminance is ensured.

As described above, the optical information reader 10 of the present embodiment includes the reflective member 50 and the image former 27. The reflective member 50 reflects the illumination light Lf emitted from the illuminant 21 toward the reading surface 14. The image former 27 is constituted such that the imaging target held over the reading surface 14 will be presented within the imaging region of the imager 23. The imaging region includes the first imaging region AR1 and the second imaging region AR2. The first imaging region AR1 is defined between the image former 27 and the reading surface 14, and the second imaging region AR2 is defined between the reading surface 14 and the reflective member 50 so as to be continuous to the first imaging region AR1 when light is reflected inside the housing on the reading surface 14. In this case, the reflective member 50 is located outside the first imaging region AR1, while the illuminant 21, the imager 23 and the image former 27 are located outside the second imaging region AR2.

Thus, the illuminant 21 emits the illumination light Lf toward the reflecting surface 55 of the reflective member 50 in the second imaging region AR2. Moreover, the reading surface 14 is open as a reading surface, and the optically transparent protective plate 16 is arranged so as to close the reading surface 14.

Thus, when capturing an image of an imaging target placed on the protective plate 16 so as to be held over the reading surface 14, the captured image may include an image of an internal part of the housing that is positionally inner than the protective plate 16 due to reflection on the protective plate 16. However, an image of the entire reflecting surface 55 of the reflective member 50 irradiated with the illumination light Lf can be easily captured. Therefore, compared to the case of directly capturing an image of the illuminant 21, the illumination light Lf can be made unnoticeable in the captured image while required illuminance is ensured. Thus, generation of optical noise due to the illumination light Lf can be minimized.

Accordingly, if the illuminant 21 is housed inside the housing, the captured image is prevented from being affected by optical noise due to reflection of the illumination light Lf. Since generation of optical noise is minimized, anti-reflection coating for the reflecting surface 55 can be omitted and thus manufacturing cost can be reduced.

In particular, the illuminant 21 emits the illumination light Lf so as to minimize variation in illumination distribution on the reflecting surface 55. Therefore, illumination is easily evenly distributed on the reflecting surface 55, resultantly making the illumination light Lf unnoticeable even more in the captured image. Accordingly, the captured image is reliably prevented from being affected by optical noise that is caused by reflection of the illumination light Lf.

Figure 9:
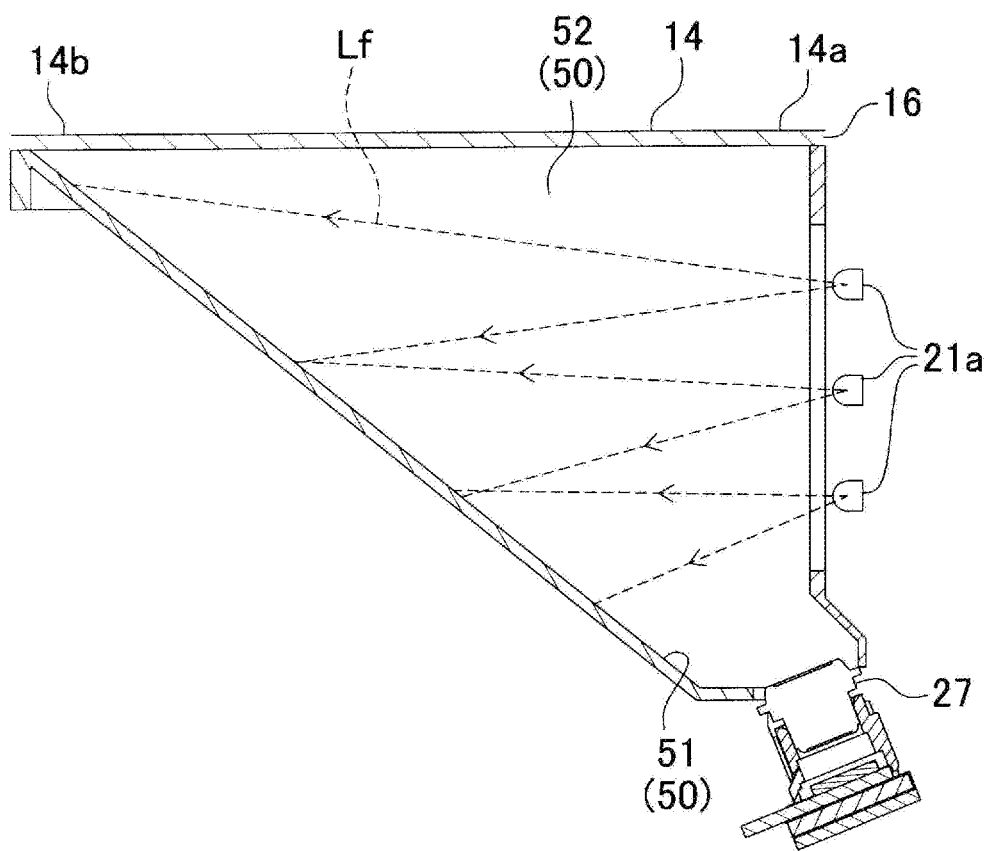
FIG. 9 is a diagram illustrating an illuminant constituted by a plurality of point light sources.

Furthermore, the illuminant 21 is a surface illuminant. Therefore, the illumination light Lf can be emitted to the reflecting surface 55 with substantially uniform illuminance, so that an optical noise prevention effect using the reflecting surface 55 is improved. As shown in FIG. 9, the illuminant 21 may be constituted by a plurality of point light sources 21a, or may be constituted by one point light source depending on the usage environment or the like.

Furthermore, a similar effect may be obtained by a configuration in which the reading surface 14 is simply opened without providing the protective plate 16. Specifically, when capturing an image of an imaging target held over the reading surface 14, the captured image may include an image of an internal part of the housing that is positionally inner than the reading surface 14 due to reflection on the imaging target. However, as long as the imaging target is held substantially parallel to and close to the reading surface 14, an image of the entire reflecting surface 55 of the reflective member 50 irradiated with the illumination light Lf can be easily captured. Accordingly, the illumination light Lf can be made unnoticeable in the captured image while required illuminance is ensured, and generation of optical nose due to the illumination light Lf can be minimized.

Second Embodiment

Figure 10:
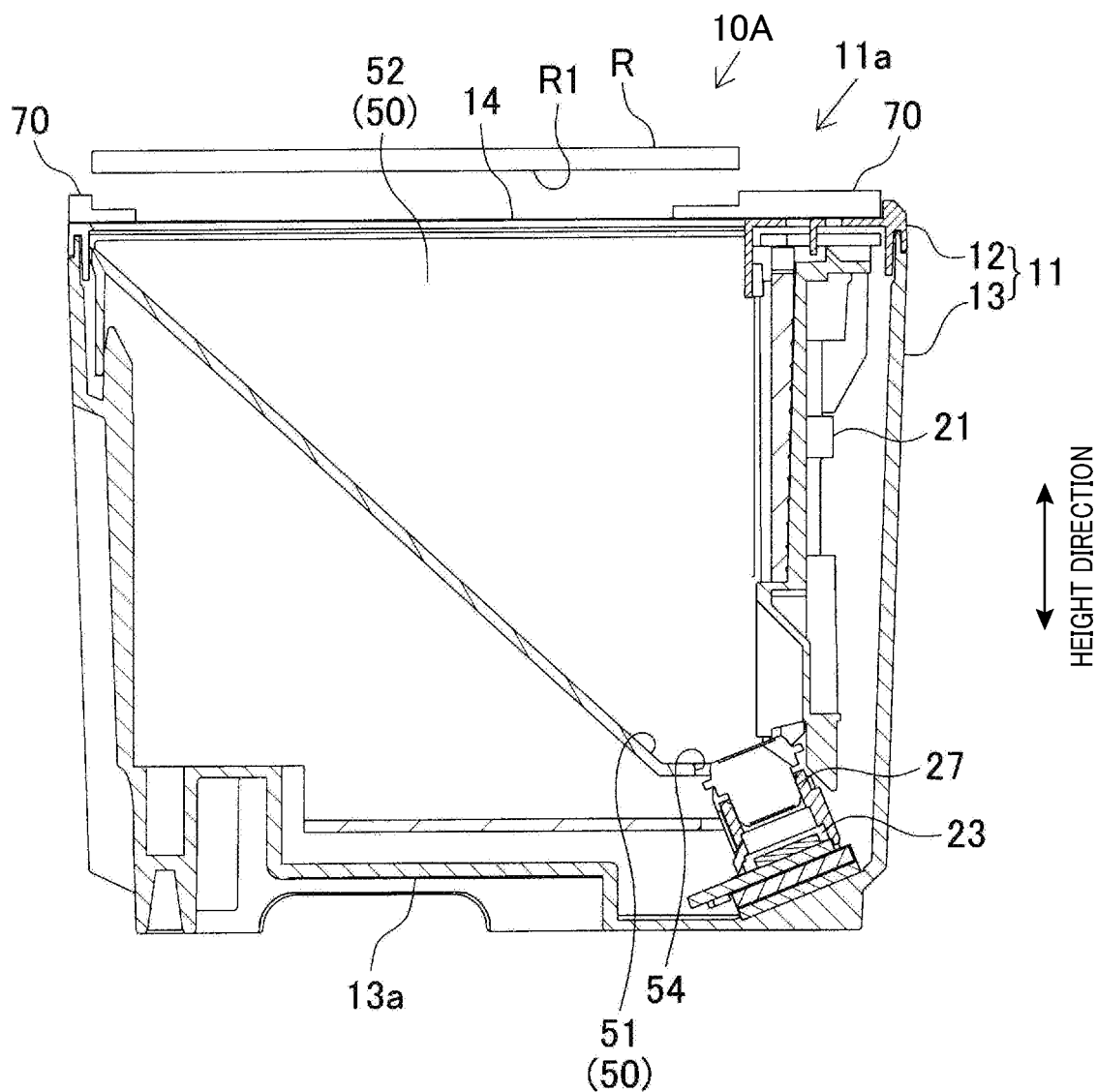
FIG. 10 is a diagram illustrating a main part of an optical information reader according to a second embodiment.

Referring now to FIG. 10, an optical information reader 10A according to a second embodiment will be described.

In the second and the subsequent embodiments, the components identical with or similar to those in the first embodiment are given the same reference signs for the sake of omitting or simplifying explanation.

The second embodiment is mainly different from the first embodiment in that the reading surface 14 is provided with a locating member for placing an imaging target thereon.

Specifically, as shown in FIG. 10, the housing 11 having no protective plate 16 is provided with a locating member 70 so that an image of an imaging target R held over the reading surface 14 can be captured at an optimum position. Specifically, the locating member 70 is detachably mounted to the housing 11 such that the imaging target R placed at an optimum position is supported from below at at least four corners. In particular, the locating member 70 is formed such that a target surface R1 of the imaging target R placed thereon will be parallel to and will be as close as possible to the reading surface 14.

Thus, since the reading surface 14 is provided with the locating member 70 for placing the imaging target R thereon, the imaging target R can be easily held over the reading surface 14. In addition to that, the position of the imaging target R relative to the reading surface 14 at the time of reading can be easily determined. Thus, although the captured image may include an image of an internal part of the housing that is positionally inner than the reading surface 14 due to reflection on the imaging target R, the captured image is unlikely to include an image of portions of the reflective member 50 other than the reflecting surface 55. Accordingly, the optical noise prevention effect using the reflecting surface 55 can be improved.

The locating member 70 does not have to be detachably provided to the housing 11, but may be integrally provided to the housing 11. The integral provision of the locating member 70 not only reduces the number of parts but also improves relative position accuracy between the locating member 70 and the reading surface 14. Thus, when capturing an image of an imaging target, the position of the imaging target can be accurately determined relative to the reading surface 14. Accordingly, the optical noise prevention effect using the reflecting surface 55 can be improved even more.

Third Embodiment

Figure 11:
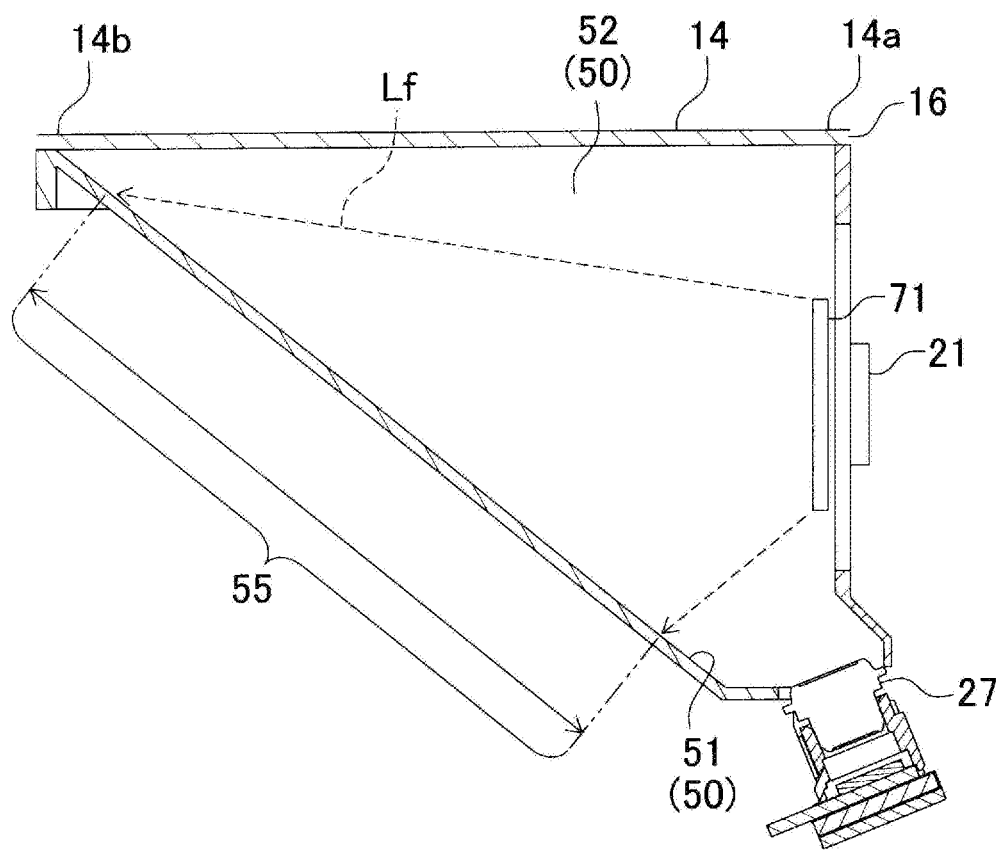
FIG. 11 is a diagram illustrating a main part of an optical information reader according to a third embodiment.

Referring to FIG. 11, an optical information reader 10 of a second embodiment will be described.

The third embodiment is mainly different from the first embodiment in that a diffusion member 71 for diffusing the illumination light Lf is disposed between the illuminant 21 and the reflective member 50.

Specifically, as shown in FIG. 11, the diffusion member 71 is arranged so as to cover an emission surface of the illuminant 21 constituted as a surface illuminant, and to emit the illumination light Lf diffused by the diffusion member 71 toward the reflecting surface 55 of the reflective member 50 outside the first imaging region AR1.

Thus, since the diffusion member 71 is disposed between the illuminant 21 and the reflective member 50 to diffuse the illumination light Lf, the illumination light Lf diffused by the diffusion member 71 is applied to the reflecting surface 55. Thus, illumination is easily evenly distributed on the reflective member 55 and thus optical noise prevention effect using the reflecting surface 55 is easily improved. In particular, use of the diffusion member 71 can reduce the size of the illuminant 21 that is constituted as a surface illuminant and thus manufacturing cost can be reduced. In addition, if the illuminant 21 is constituted by a plurality of point light sources, the number of required point light sources can be reduced and thus manufacturing cost can be reduced.

Fourth Embodiment

Referring to FIG. 5 previously referred to, an optical information reader according to a fourth embodiment will be described.

The fourth embodiment is mainly different from the first embodiment in that the reflecting surface 55 of the reflective member 50 (e.g., see FIG. 5) is provided with asperities (not shown).

Specifically, the reflective member 50 is subjected to texture processing or the like to form asperities on at least the reflecting surface 55.

Thus, provision of asperities to the reflecting surface 55 of the reflective member 50 can easily achieve uniform illumination distribution owing to irregular reflection or the like of the illumination light Lf on the reflecting surface 55. Accordingly, optical noise prevention effect using the reflecting surface 55 is improved.

Formation of asperities is not limited to only on the reflecting surface 55, but asperities may be formed on other portions of the reflective member 50. Asperities may be provided to the reflecting surface 55 and the like not only by use of texture processing, but also by use of other processing as long as the illumination light Lf can be irregularly reflected.

Fifth Embodiment

Figure 12:
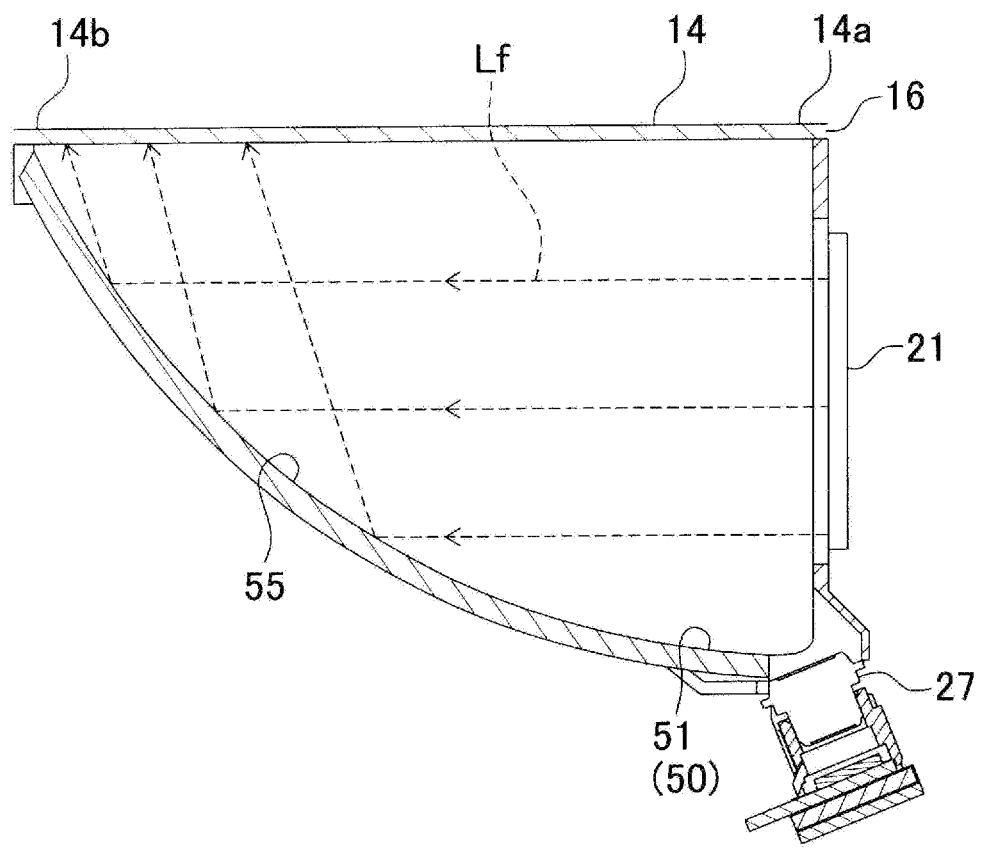
FIG. 12 is a diagram illustrating a main part of an optical information reader according to a fifth embodiment.

Referring to FIG. 12, an optical information reader according to a fifth embodiment will be described.

The fifth embodiment is mainly different from the first embodiment in that illumination distribution on the reading surface is controlled.

Specifically, in terms of illumination distribution on the reading surface 14, for example, the reflective member 50 is formed into a curved shape such that, as shown in FIG. 12, the reflecting surface 55 has a concave curve in a direction away from the illuminant 21 to compensate for reduction in ambient light in the image former 27. Thus, in an area of the side 14b of the reading surface 14 near the reflective member 50, the distance to the reflecting surface 55 becomes short relative to the center of the reading surface 14, compared to the case where the reflecting surface 55 is formed into a flat shape. Therefore, illumination distribution in the area of the side 14b of the reading surface 14 near the reflective member 50 can be enhanced relative to the center of the reading surface 14.

Thus, the reflecting surface 55 formed into a curved shape enables uniform illumination distribution on the reflecting surface 55, and at the same time, illumination distribution on the reading surface 14 can be controlled for the illumination light Lf reflected on the reflecting surface 55. In other words, illumination distribution on the reading surface 14 can be controlled according to the curvature of the reflecting surface 55. It should be noted that the illumination distribution on the reflecting surface 55 is assumed to be uniform due to the illumination light Lf from the illuminant 21.

<First Modification>

Figure 13:
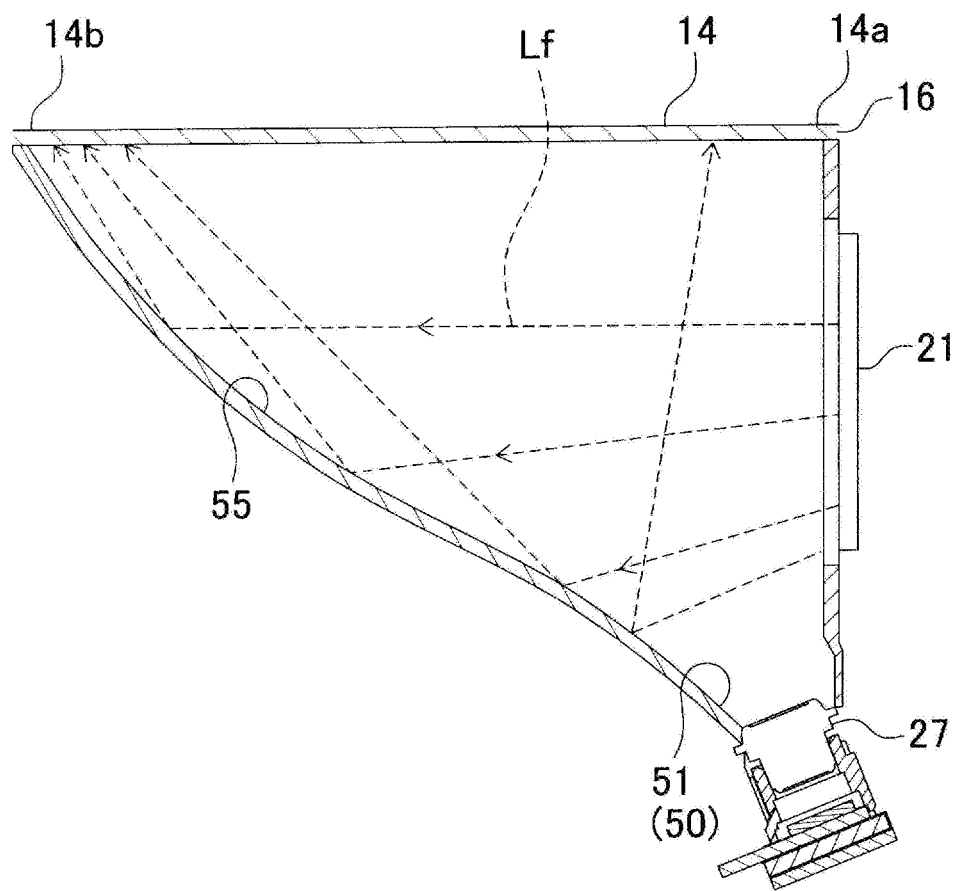
FIG. 13 is a diagram illustrating a main part of an optical information reader according to a first modification of the fifth embodiment.

As a first modification of the present embodiment, as shown in FIG. 13, for example, a lower portion of the reflecting surface 55 also has a convex curve in a direction approaching the illuminant 21. Therefore, the illumination light Lf reflected on the convex portion of the reflecting surface 55 is easily collected to an area of the side (edge) 14a of the reading surface 14 near the illuminant 21, compared to the case where the reflecting surface 55 is formed into a flat shape. Thus, illumination distribution in the area of the side 14a of the reading surface 14 near the illuminant 21 is permitted to be relatively high compared to the illumination distribution at the center of the of the reading surface 14 to thereby compensate for reduction in ambient light in the image former 27.

<Second Modification>

Figure 14:
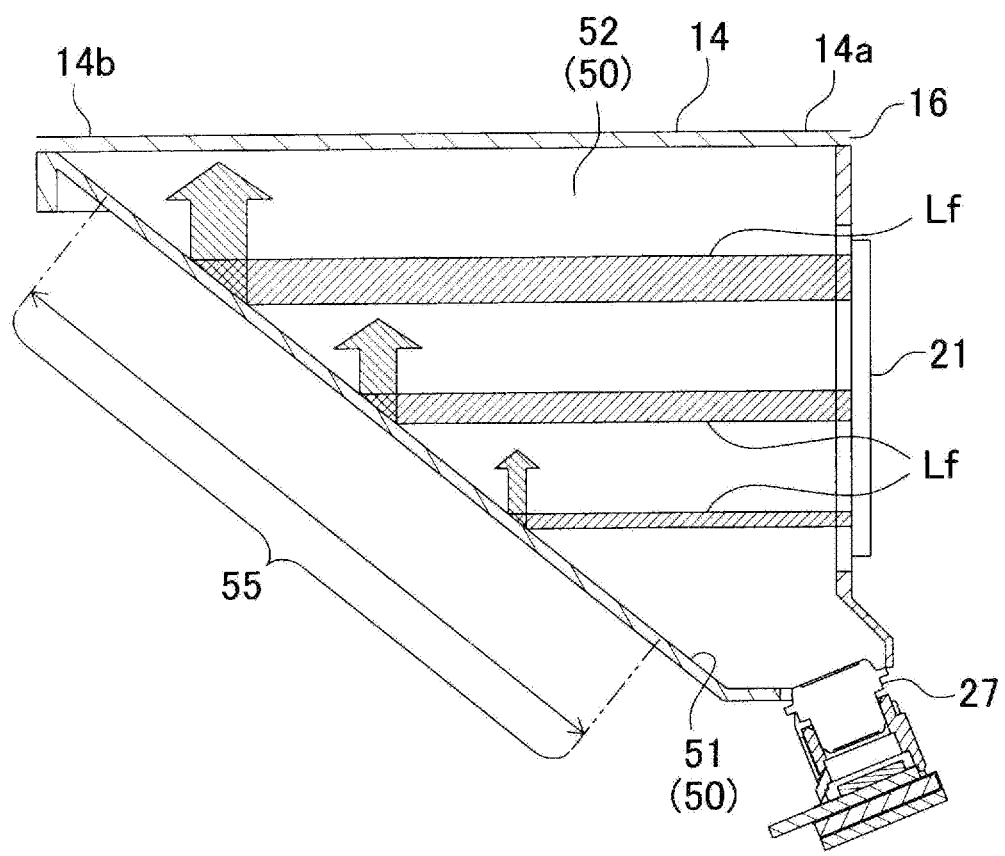
FIG. 14 is a diagram illustrating a main part of an optical information reader according to a second modification of the fifth embodiment.

As a second modification of the present embodiment, the illuminant 21 may emit the illumination light Lf such that illumination distribution on the flat reflecting surface 55 gradually varies according to the distance from the illuminant 21. Specifically, for example, the illuminant 21 may be constituted such that, as shown in FIG. 14, illuminance of the emitted illumination light Lf is enhanced more as the distance from the reflecting surface 55 increases in an emission surface of the illuminant 21.

In this way, for example, while variation in illumination distribution is minimized on the reflecting surface 55, illumination distribution is permitted to be higher in the area of the side 14b of the reading surface 14 near the reflective member 50 to thereby compensate for reduction in ambient light in the imager former 27.

Sixth Embodiment

Figure 15:
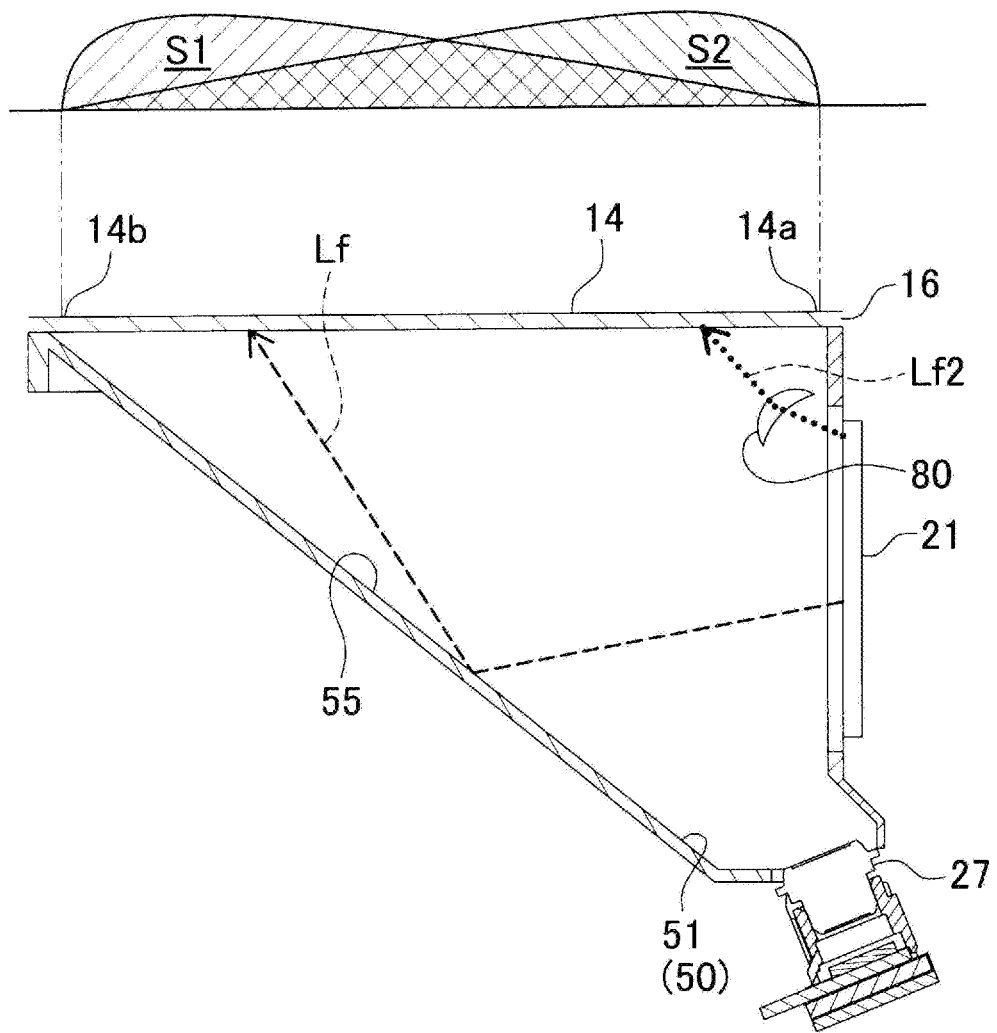
FIG. 15 is a diagram illustrating a main part of an optical information reader according to a sixth embodiment.
Figure 16:
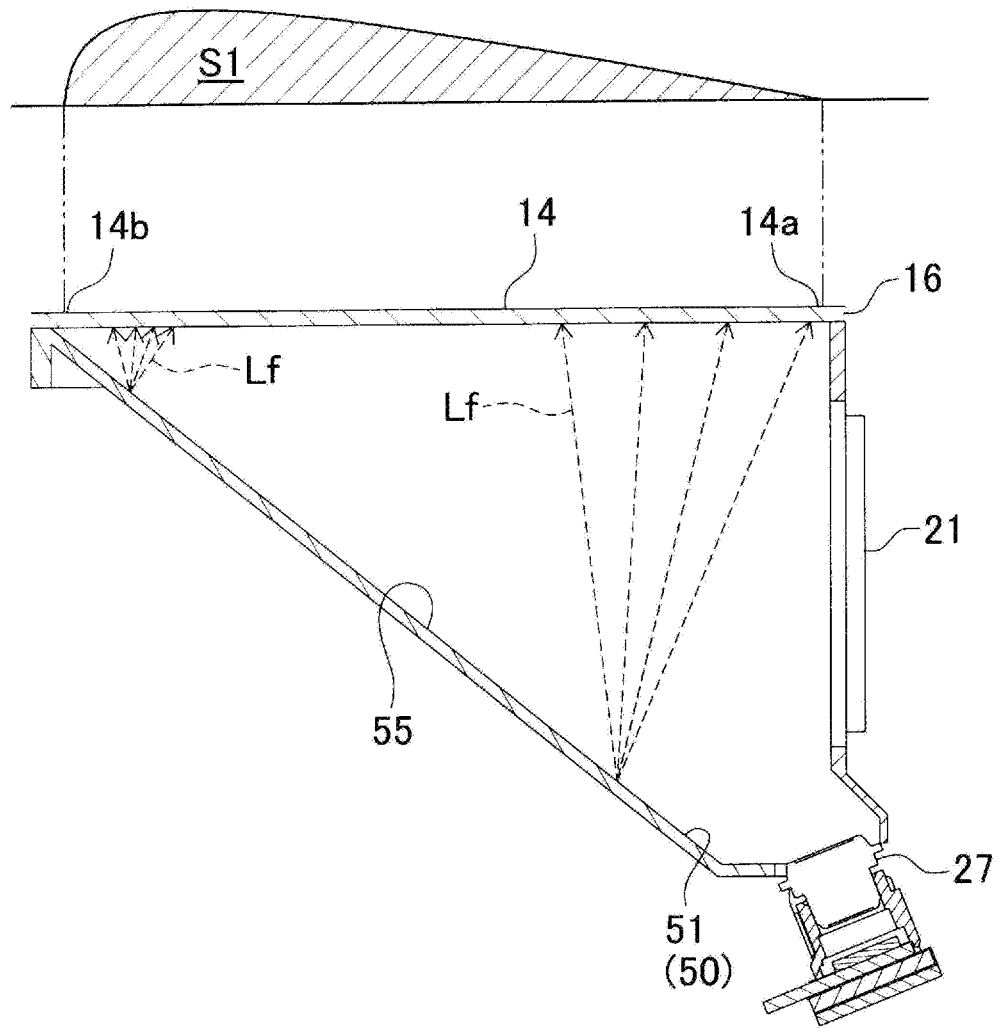
FIG. 16 is a diagram illustrating illuminance distribution on a reading surface due to illumination light emitted from a reflecting surface where illuminance distribution is even.

Referring to FIGS. 15 and 16, an optical information reader according to a sixth embodiment will be described.

The sixth embodiment is mainly different from the fifth embodiment in that illumination light is emitted toward a predetermined range of the reading surface 14 without intervention of the reflective member 50.

If illumination distribution is uneven on the reflecting surface 55 in a flat shape, the reading surface 14 has illumination distribution 51, as shown in FIG. 16, which lowers as the distance from the reflecting surface 55 increases. In other words, illuminance is comparatively high in the area of the side 14b of the reading surface 14 near the reflective member 50, while it is comparatively low in the area of the side 14a of the reading surface 14 near the illuminant 21.

Therefore, in the present embodiment, there is separately provided a lens 80, as shown in FIG. 15, used for directing part of illumination light emitted from the illuminant 21 toward the area of the side 14a of the reading surface 14 near the illuminant 21 without intervention of the reflective member 50. Thus, illumination distribution S2 on the reading surface 14 due to illumination light Lf2 via the lens 80 has comparatively high illuminance in the area of the side 14a of the reading surface 14 near the illuminant 21. In this way, illuminance can be increased in the area of the side 14a of the reading surface 14 near the illuminant 21 to thereby compensate for reduction in ambient light of the image former 27.

<Modification>

Figure 17:
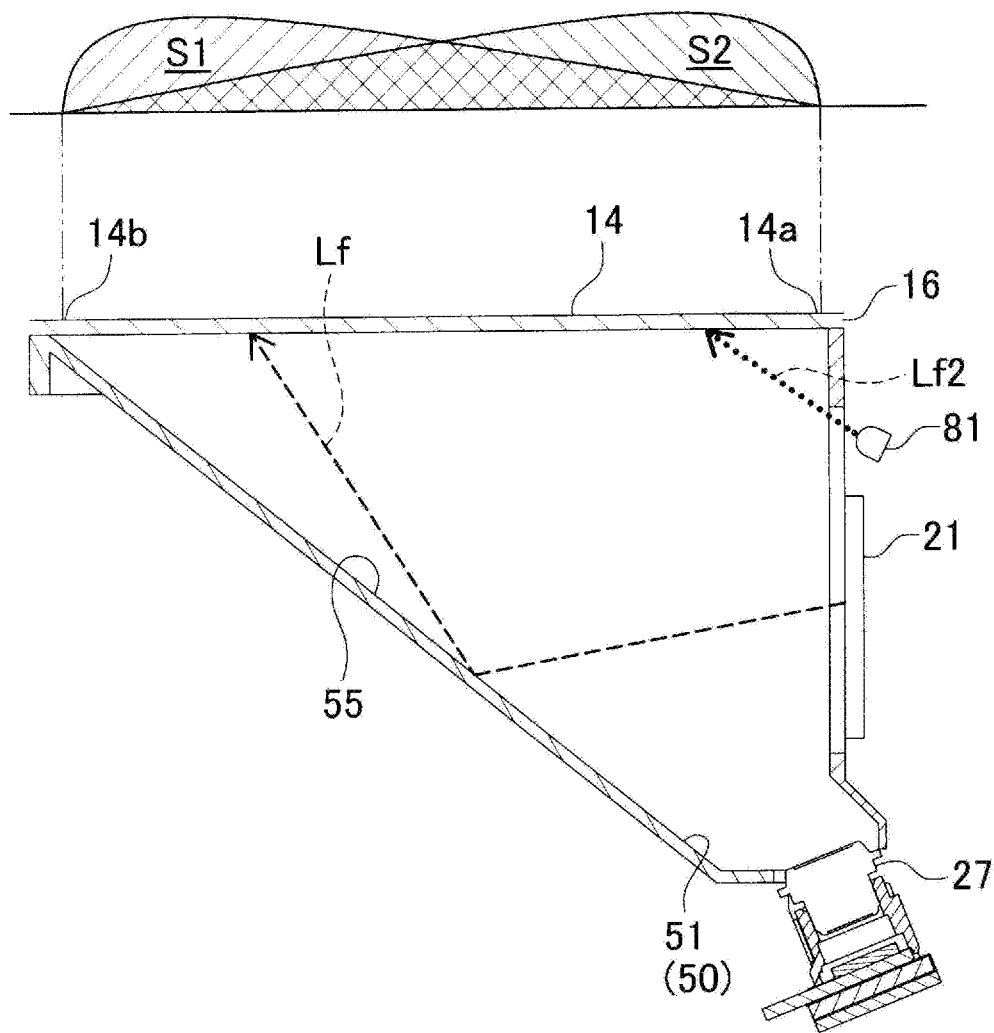
FIG. 17 is a diagram illustrating a main part of an optical information reader according to a modification of the sixth embodiment.

As a modification of the present embodiment, there may be provided a second illuminant 81 which emits illumination light Lf2 as second illumination light toward a predetermined range of the reading surface 14. For example, as shown in FIG. 17, the illumination light Lf2 of the second illuminant 81 may be emitted toward the area of the side 14a of the reading surface 14 near the illuminant 21, as the predetermined range, to compensate for reduction in ambient light of the image former 27.

The target of applying illumination light using the lens 80 or the second illuminant 81 is not limited to the area of the side 14a of the reading surface 14 near the illuminant 21, but may be some range of the reading surface 14 where illuminance is desired to be increased.

Seventh Embodiment

Figure 18:
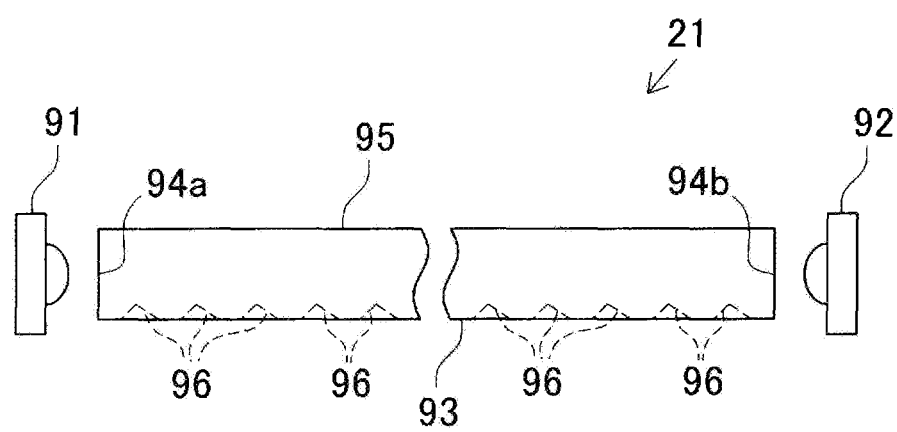
FIG. 18 is a diagram illustrating a main part of an optical information reader according to a seventh embodiment.

Referring to FIG. 18, an optical information reader according to a seventh embodiment will be described.

The seventh embodiment is mainly different from the sixth embodiment in that illumination light is emitted in several directions according to the shape of a light guide plate provided to a surface illuminant.

In the present embodiment, as shown in FIG. 18, the illuminant 21 includes a first light emitter 91, a second light emitter 92 and a light guide plate 93 disposed between the first and second light emitters 91 and 92. The light guide plate 93 has a first side face 94a where light from the first light emitter 91 is incident, and a second side face 94b where light from the second light emitter 92 is incident. The light guide plate 93 includes, on the inside thereof, a plurality of grooves 96 which reflect light that is incident on the first and second side faces 94a and 94b toward an emission surface 95. The plurality of grooves 96 each have a first side face 96a on a first side face 94a side, and a second side face 96b on a second side face 94b side, which are differently shaped so that the groove 96 has an asymmetrical shape.

Figure 19A:
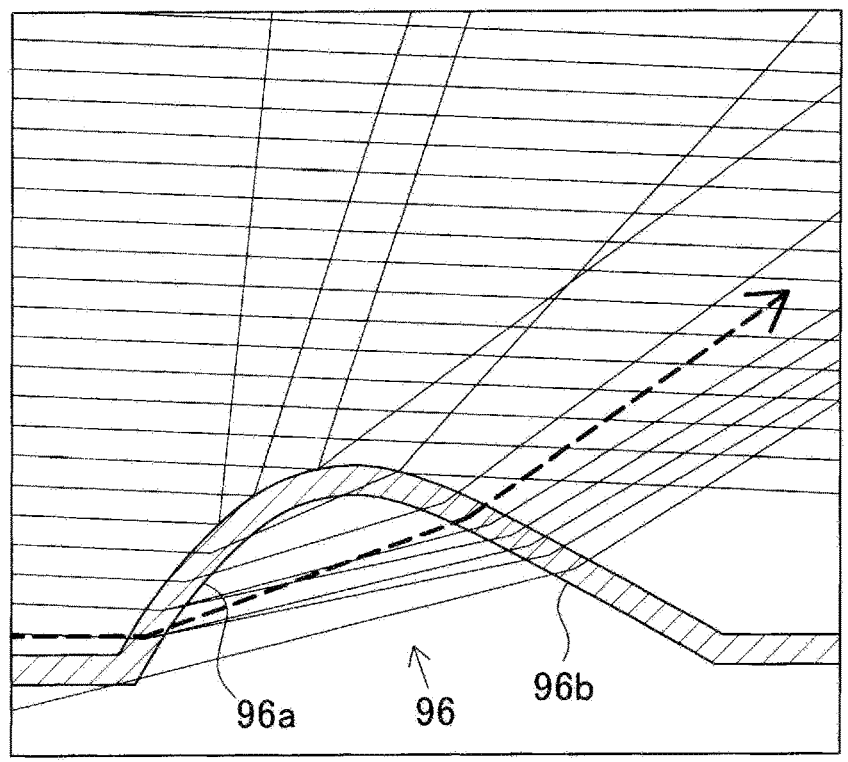
FIG. 19A is a diagram illustrating a direction in which light from a first side face is emitted as illumination light.
Figure 19B:
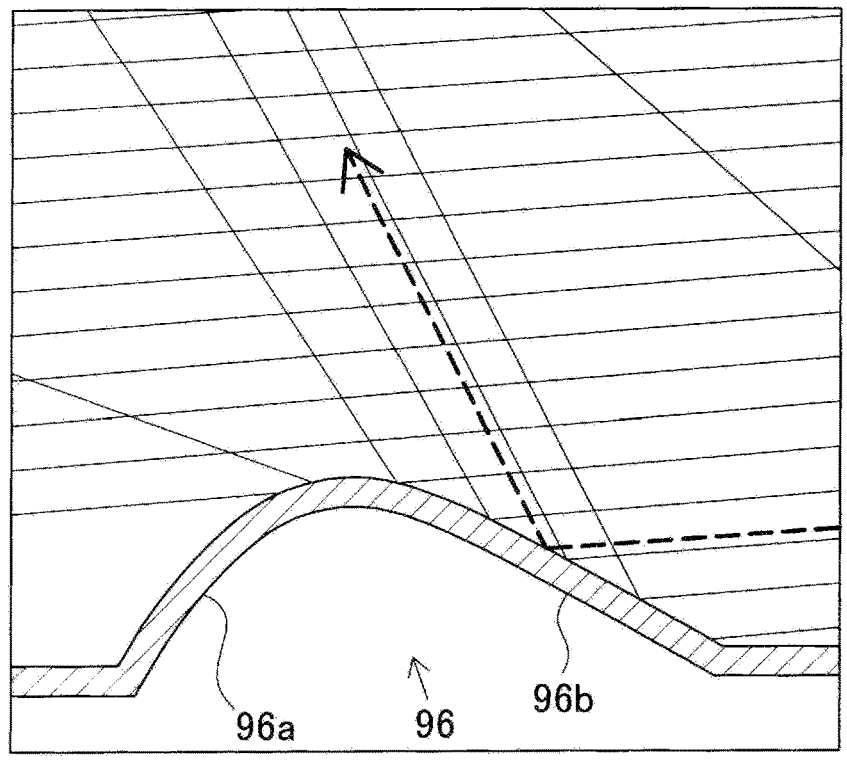
FIG. 19B is a diagram illustrating a direction in which light from a second side face is emitted as illumination light.

Specifically, each groove 96 is formed so that the first side face 96a has a curved surface with a large curvature. Therefore, as shown in FIG. 19A, light is emitted from the emission surface 95 in conformity with the direction in which the light from the first side face 94a is transmitted through the first and second side faces 96a and 96b. The second side face 96b is formed so as to have a curved surface with a small curvature approximate to a flat portion or a plane. Therefore, as shown in FIG. 19B, light is emitted from the emission surface 95 in conformity with the direction in which the light from the second side face 94b is reflected on the second side face 96b.

Specifically, the direction of illumination light emitted from the emission surface can be branched into at least two directions, i.e., a direction attributed to the shape of the first side face 96a and a direction attributed to the shape of the second side face 96b. Thus, the first and second side faces 96a and 96b of each groove 96 are formed such that one emission direction matches a direction toward the reflecting surface 55, and the other emission direction matches a direction toward a predetermined range of the reading surface 14 where illuminance is insufficient. Accordingly, advantageous effects similar to those of the sixth embodiment can be obtained.

In this way, illumination distribution of the illumination light Lf emitted from the emission surface is easily varied, compared to the case where each of the plurality of grooves 96 is symmetrically formed between the face facing the first side face 94a and the face facing the second side face 94b. Specifically, by changing the shape of each of the plurality of grooves 96 according to desired illumination distribution of the illumination light Lf, the illumination light Lf can be emitted in a plurality of directions via the emission surface. In addition to that, emission direction can be controlled, for example, by emitting part of the illumination light Lf toward the reflecting surface 55 and emitting another part of the illumination light Lf toward an end of the reading surface 14 where ambient light of the image former 27 is reduced.

<First Modification>

Figure 20:
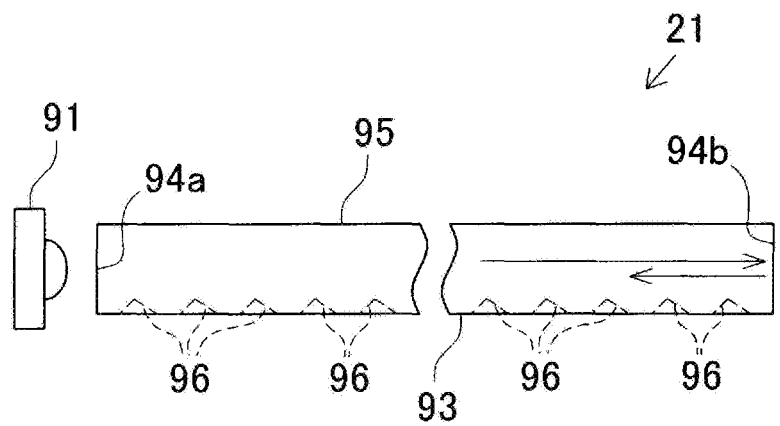
FIG. 20 is a diagram illustrating a main part of an optical information reader according to a first modification of the seventh embodiment.

As a first modification of the present embodiment, as shown in FIG. 20, the second light emitter 92 may be eliminated. Specifically, the modification of the present embodiment is ensured to include a first light emitter 91 and a light guide plate 93 having a first side face 94a where light from the first light emitter 91 is incident.

In this configuration, light incident on the first side face 94a is internally reflected on the second side face 94b toward the first side face 94a, so that the illumination light Lf emitted from the emission surface is also easily varied. Thus, by changing the shape of each of the plurality of grooves 96 according to desired illumination distribution of the illumination light Lf, the illumination light Lf can be emitted in a plurality of directions via the emission surface. In addition to that, the emission direction can be controlled. In particular, since the first light emitter 91 only has to be arranged facing the first side face 94a without the need of arranging the second light emitter 92 facing the second side face 94b, space and the number of parts can be reduced.

<Second Modification>

Figure 21:
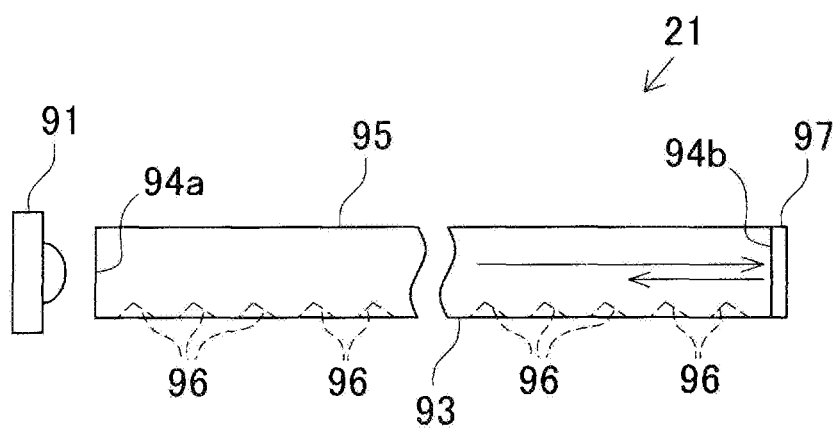
FIG. 21 is a diagram illustrating a main part of an optical information reader according to a second modification of the seventh embodiment.

In a second modification of the present embodiment, as shown in FIG. 21, the second side face 94b, from which the second light emitter 92 has been eliminated, may be provided with a reflective member 97. This may increase reflection efficiency because light incident on the first side face 94a is easily internally reflected on the second side face 94b toward the first side face 94a. Therefore, a part of light incident on the first side face 94a is prevented from passing through the second side face 94b, which would otherwise have passed therethrough in the absence of the reflective member 97. Consequently, illuminance can be increased in the illumination light Lf which is emitted in a plurality of directions via the emission surface.

In the first modification, the first light emitter 91 may be eliminated leaving the second light emitter 92. In the second modification, the first light emitter 91 may be eliminated leaving the second light emitter 92, and the reflective member 97 may be provided to the first side face 94a. Specifically, the illuminant 21 may include a light emitter, and a light guide plate 93 having a first side face where light from the light emitter is incident. In this case, the light guide plate 93 may include, on the inside thereof, a plurality of grooves 96 on which the light incident on the first side face is reflected toward the emission surface 95. Of the side faces of the light guide plate 93, when a side face facing away from the first side face is referred to as a second side face, each of the plurality of grooves 96 may be asymmetrically formed so that a surface thereof facing the first side face is different from a surface thereof facing the second side face.

The present invention is not limited to the embodiments and modifications described above, but may be embodied, for example, as follows.

Figure 22:
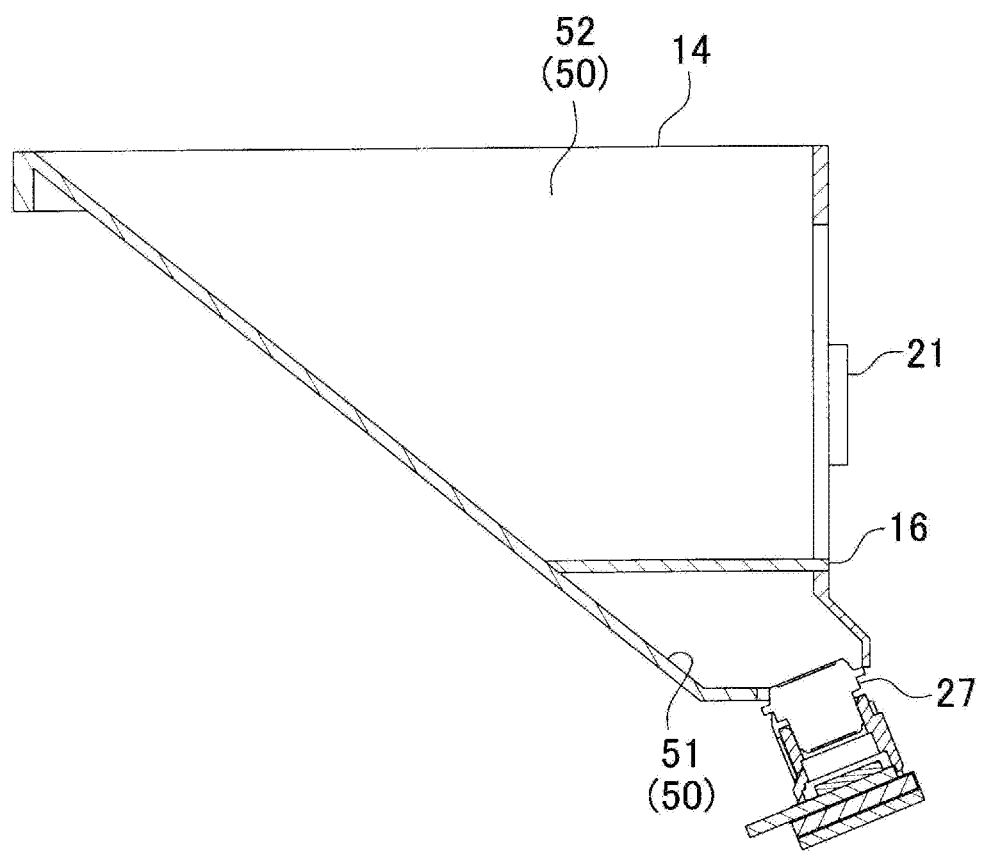
FIG. 22 is a diagram illustrating, as a modification, a state in which a protective plate is disposed at a position lower than an illuminant.

(1) As described above, the position of arranging the protective plate 16 has been at the level of the reading surface 14. Alternatively, for example, the protective plate 16 may be arranged, as shown in FIG. 22, inside the housing 11, i.e., at a level lower than the illuminant 21. With this configuration as well, the occurrence of optical noise is minimized, which is due to the illumination light Lf from the illuminant 21 being reflected on the protective plate 16.

(2) The top surface 11a of the housing 11 has been constituted by the reading surface 14 and the end portion 15, with the edge portions along the respective sides 14b to 14d each being permitted to have a width smaller than that of the end portion. Alternatively, for example, the reading surface 14 may be arranged at the center of the top surface 11a so that the edge portions along the respective sides (edges) 14a to 14d have widths substantially equal to each other.

(3) The operating part 42, the display 43 and the like have been collectively arranged on the end portion 15. Alternatively, a part of these components may be arranged, for example, on a side face of the housing 11.

(4) The imaging region defined by the image former 27 has been set such that the range continuous to the first imaging region AR1 serves as the second imaging region AR2, when light is internally reflected on the reading surface 14, such as the protective plate 16, in the housing. Alternatively, the imaging region may be set such that a part of the range continuous to the first imaging region AR1 includes another part of the housing other than the reflective member 50 to an extent not raising any problem in actual operation, when light is internally reflected on the reading surface 14, such as the protective plate 16, in the housing.

Eighth Embodiment

Referring to FIGS. 23 to 27, an optical information reader according to an eighth embodiment will be described.

Figure 23:
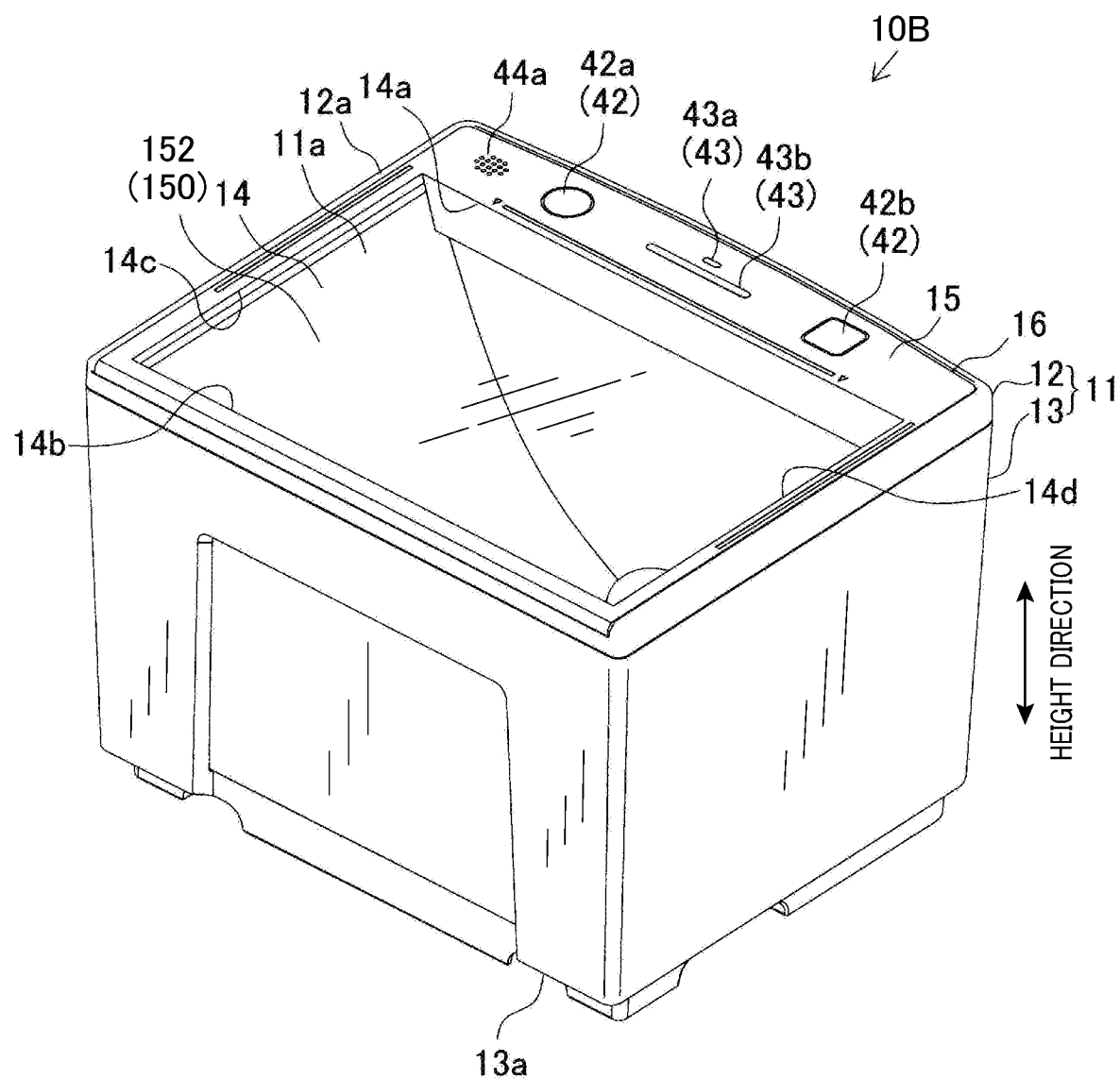
FIG. 23 is a perspective view illustrating an optical information reader according to an eighth embodiment.
Figure 24:
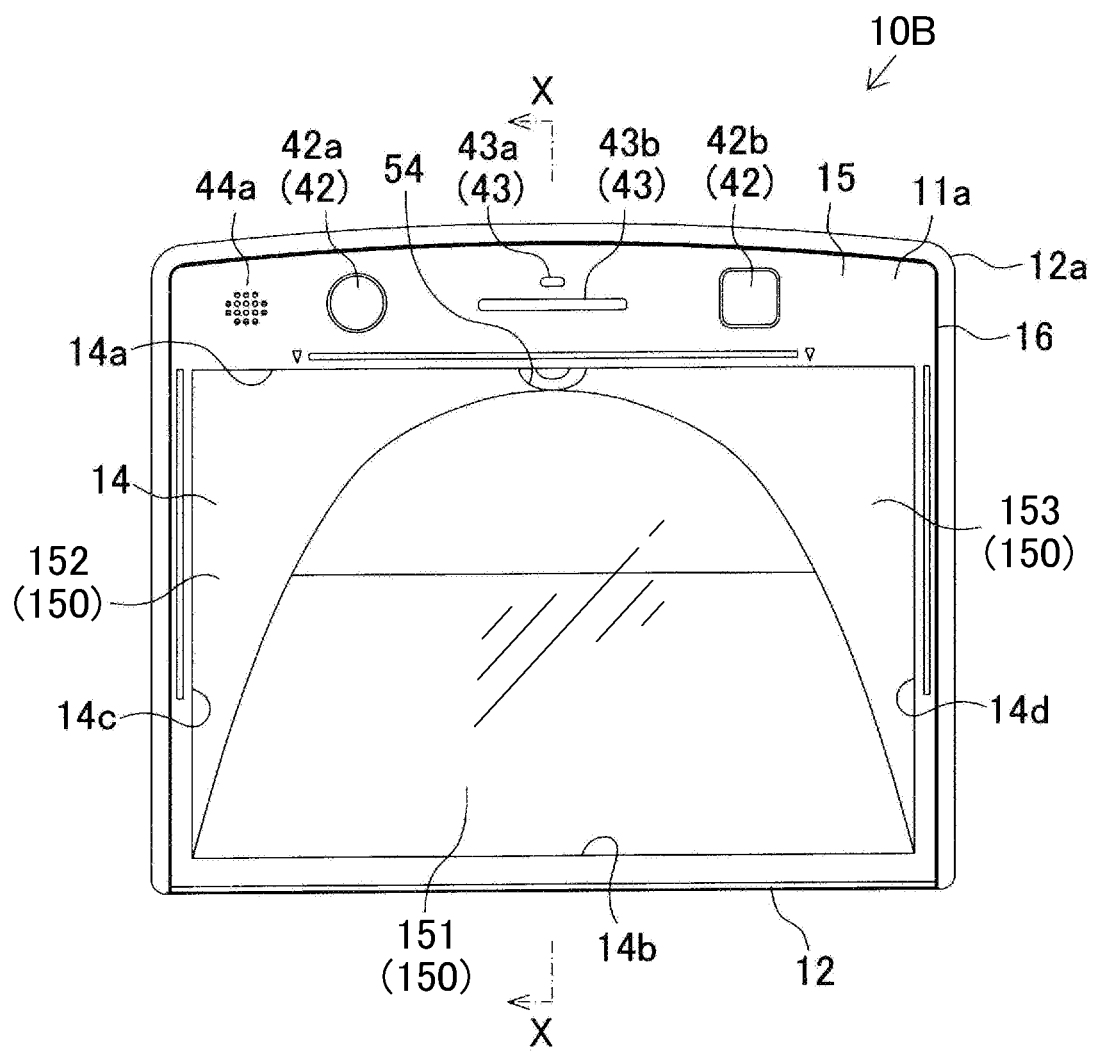
FIG. 24 is a plan view illustrating the optical information reader of FIG. 23.
Figure 25:
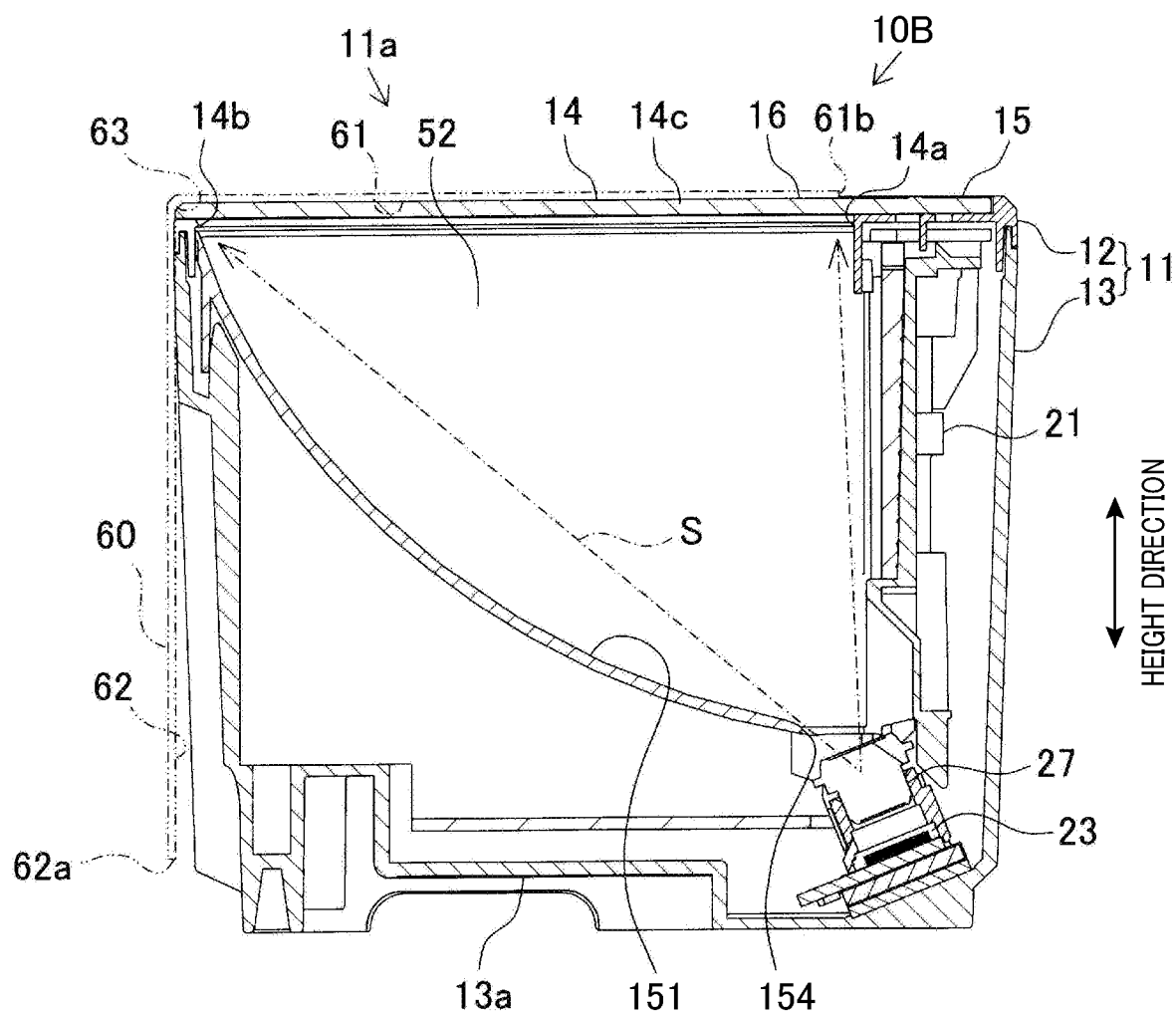
FIG. 25 is a schematic cross-sectional view illustrating the optical information reader taken along the line X-X of FIG. 24.

FIGS. 23 to 25 schematically illustrate a configuration of an optical information reader 10B of the eighth embodiment. The optical information reader 10B is constituted similarly to the optical information reader 10 of the first embodiment except for the configuration of a reflective member 150 described later. Therefore, differences from the optical information reader 10 of the first embodiment will be described, focusing on the structure and function of the reflective member 150. Accordingly, the components identical with or similar to those of the reader 10 are given the same reference signs.

The optical information reader 10B of the eighth embodiment includes:

a housing 11 having a top surface 11a in which a rectangular reading surface is formed;

an imager 23 arranged inside the housing 11 to capture an image of a target surface 61 of a reading target medium (e.g., passport 60) held over the reading surface 14;

a reading part 40 that reads given information on the target surface 61, based on a result of imaging performed by the imager 23;

an operation part 42 that is operable from outside the reader 10B; and a display 43 that can display a result of reading performed by the reading part 40, wherein the top surface 11a is ensured, as will be understood from FIGS. 23 and 24, to include the reading surface 14 and an end portion (surface extending along an end) 15 continuous to a side 14a of the reading surface, and the operation part 42 and the display 43 are arranged on the end portion 15.

In the optical information reader 10B, as in the first embodiment, the optical system includes a projection optical system and a light-receiving optical system. The illuminant 21 constituting the projection optical system serves as a surface illuminant that can emit uniform illumination light. The illuminant 21 is arranged below the end portion 15 and is ensured to emit uniform illumination light toward the reflective member 50. Thus, even when the reflective member 50 is included in a field of view of the imager 23 due to reflection on the protective plate 16, the influence of the reflective member 50 being included in in a captured image can be minimized because the reflective member 50 becomes evenly bright.

As shown in FIGS. 23 to 25, the projection optical system includes a reflective member 150 that reflects and guides light from the illuminant 21. The reflective member 150 is arranged in the housing 11 at a position where illumination light from the illuminant 21 is applied. The reflective member 150 is constituted such that illumination light from the illuminant 21 passes through the reading surface 14 and is emitted to the outside of the housing 11. The reflective member 150 includes a first reflector 151, a second reflector 152 and a third reflector 153. These reflectors are each formed so as to have a convex curve in a direction away from the illuminant 21 to increase illuminance in areas of outer edges of the reading surface 14 more than in a center area of the reading surface 14.

Specifically, as shown in FIG. 25, the first reflector 151 is formed in a curved shape so that an upper end thereof will be continuous to the side 14b of the reading surface 14. Also, the second and third reflectors 152 and 153 are formed in curved shapes so that upper ends thereof will be respectively continuous to the sides 14c and 14d of the reading surface 14. The first, second and third reflectors 151, 152 and 153 have respective lower ends defining an opening 54. The opening 54 is formed so as to expose the image former 27 therefrom.

As shown in FIG. 25 as well as FIG. 6 previously referred to, the light-receiving optical system constituted by the imager 23, the image former 27 and other components. The imager 23 is constituted as an imaging means that includes a light-receiving sensor (area sensor) where solid-state imaging devices (light-receiving devices) are two-dimensionally arrayed. The imager 23 is provided with a light-receiving surface 23a at a position facing the image former 27 to receive light from outside the housing. The imager 23 is mounted to a substrate so as to receive light that has entered the light-receiving system via the reading surface 14, passed through the image former 27 and is incident on the light-receiving surface 23a.

The image former 27 is ensured to determine a field of view in which an image can be captured by the imager 23 and to guide light that has entered from outside the housing 11 into the light-receiving system via the reading surface 14 to the light-receiving surface 23a of the imager 23. In particular, the image former 27 is arranged such that the reading surface 14 will be inside the field of view and the reflective member 50 will be outside the field of view excepting reflection on the protective plate 16 or a reading target (see the dash-dot lines of FIG. 25).

Furthermore, the image former 27 operates such that, when an imaging target, e.g., the target surface 61, is placed within the field of view on the outside of the housing 11, an image of the imaging target will be formed on the light-receiving surface 23a of the imager 23. In the present structure, an image of the imaging target is ensured to be captured, while the imaging target is irradiated with illumination light guided from the housing by the reflective member 150. Moreover, the image former 27 is constituted to collect reflected light from the imaging target when an imaging target is placed within the field of view (in the imaging area), and to form an image of the imaging target on the light-receiving surface 23a of the imager 23.

Figure 26:
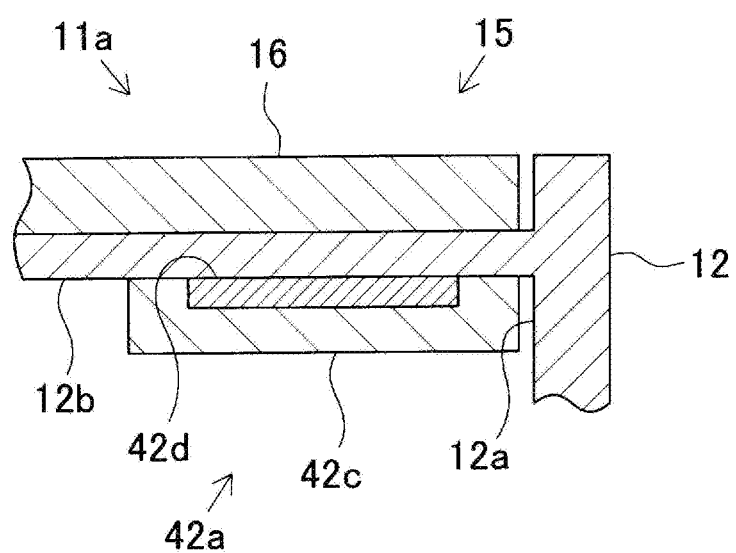
FIG. 26 is an enlarged cross-sectional view illustrating a relationship between an extension segment, a protective plate and a detection electrode.

The structure of the electrical circuit system including the control unit 440 based on FIG. 6 previously referred to is applied to the optical information reader 10B of the present embodiment. In this structure, the mode switch 42a is constituted using a substrate 42c in which a detection electrode 42d for detecting touch via the protective plate 16 is formed. To improve static resistance without impairing sensitivity of the detection electrode 42d, the housing 11 is arranged so that a part thereof is interposed between the detection electrode 42d and the protective plate 16. For example, as shown in FIG. 26, a part of the housing 11 may be constituted as an extension segment 12b which extends flat toward the installation surface from an edge portion of an inner wall of the square ring-shaped body 12a of the upper casing 12. The scan switch 42b may also be constituted similarly to the mode switch 42a.

Other components of the electrical circuit system are constituted as in FIG. 6 previously referred to.

Figure 27:
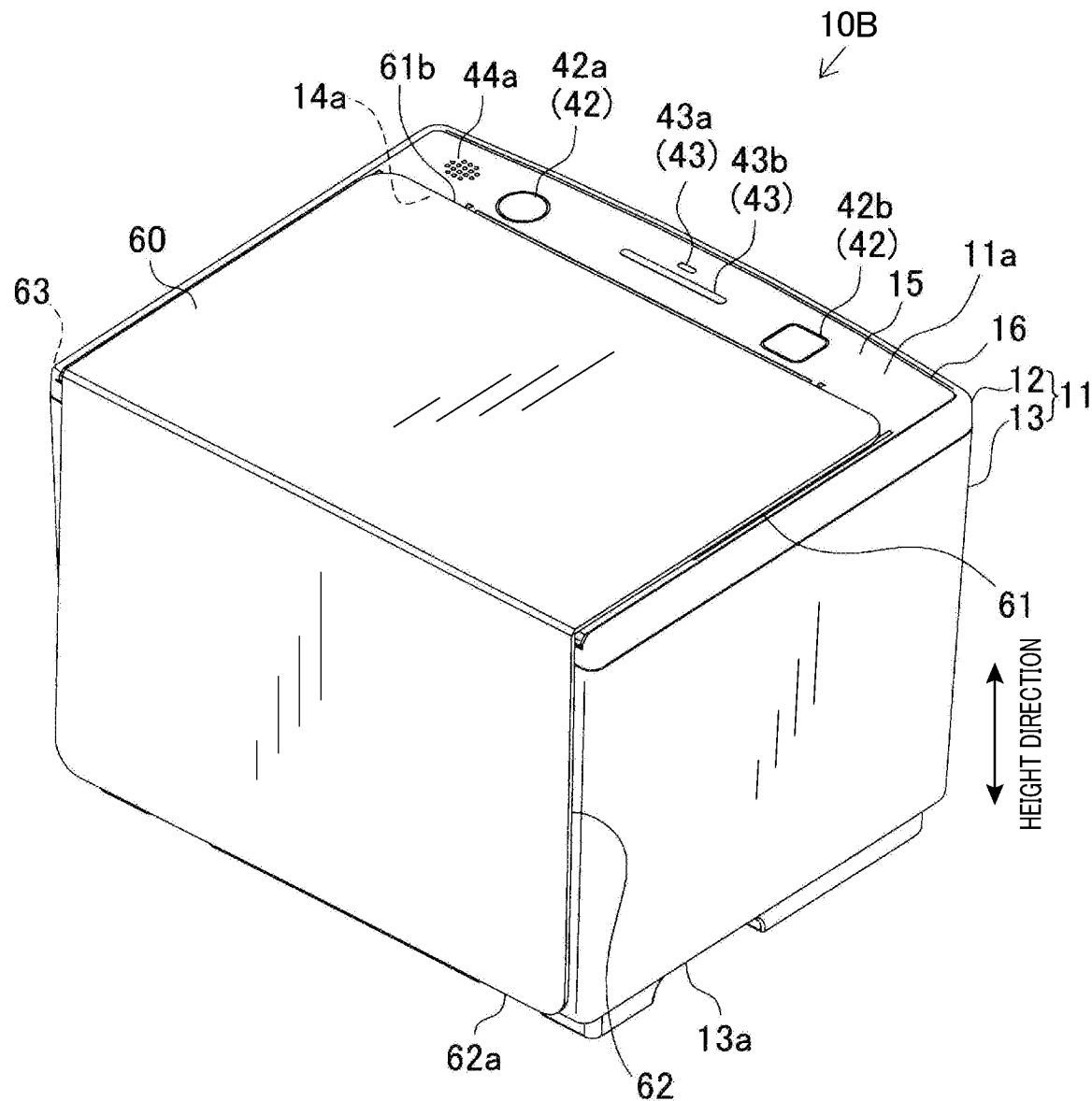
FIG. 27 is a perspective view illustrating a state in which a target surface of a passport is placed over a reading surface so as to be in contact therewith.

For example, when the passport 60 is read using the optical information reader 10B constituted in this way, the mode switch 42a is operated to switch mode to the passport reading mode, and then, as shown in FIG. 27, the scan switch 42b is operated in a state in which the target surface 61 is held over the reading surface 14 so as to contact therewith, with the boundary being aligned parallel to an edge (14b) of the top surface 11a. Thus, an image of the target surface 61 is captured in a state in which the target surface is irradiated with the illumination light emitted from the illuminant 21, and the passport information 61a and the like on the target surface 61 are recognized using an OCR technique.

Furthermore, for example, when reading an information code on a target surface such as a given paper form as a reading target medium, the mode switch 42a is operated to switch mode to the information reading mode, and then the scan switch 42b is operated in a state in which the information code on the target surface is held over the reading surface 14. Thus, an image of the target surface is captured in a state in which the target surface is irradiated with the illumination light emitted from the illuminant 21, and the code image of the information code on the target surface is analyzed to thereby decode and read the information recorded on the information code.

As in the first embodiment, when an image of the target surface of a driver's license is captured and stored, the mode switch 42a is operated to switch mode to the license reading mode, and then the scan switch 42b is operated in a state in which the target surface is held over the reading surface 14. Thus, an image of the target surface of the driver's license is captured in a state in which the target surface is irradiated with the illumination light emitted from the illuminant 21, and the captured image is stored in the memory 35 or the like.

As described above, in the optical information reader 10B of the present embodiment, the top surface 11a of the housing 11 includes the rectangular reading surface 14 and the end portion 15 that is continuous to the side 14a of the reading surface 14, with the operation part 42 and the display 43 being arranged on the end portion (surface portion at an end) 15. Thus, of the top surface 11a of the housing 11, the portion excluding the end portion 15 where the operation part 42 and the display 43 are arranged serves as the reading surface 14. Therefore, for example, compared to the case where an operation part and a display are arranged on a top surface of a housing including a reading surface, a larger area of the top surface 11a of the housing 11 can be used as the rectangular reading surface 14. This ensures a square reading surface 14 with a required size and thus a reading target medium can be easily held over the reading surface 14, while the size of the housing 11 can be reduced.

In particular, of the four sides (or edges) of the reading surface 14, the side 14b, which faces the side 14a that is continuous to the end portion 15, corresponds to an edge of the top surface 11a of the housing 11. Therefore, when a reading target as a reading target medium is one of two facing pages, e.g., the passport 60, showing given information, positional displacement of the target surface of the reading target medium relative to the reading surface 14 is minimized and the target surface is unlikely to be placed over the end portion 15, by placing the target surface over the reading surface 14 such that the boundary between the two facing pages is aligned parallel to the edge of the top surface 11a.

In the example of the passport 60, the target surface 61 is placed over the reading surface 14 with the boundary 63 being aligned parallel to the edge of the top surface 11a to minimize positional displacement of the target surface 61 relative to the reading surface 14 and to avoid placement of the target surface 61 over the end portion 15. Thus, while reading efficiency is ensured, operability of the operation part 42 and visibility of the display 43 are also ensured.

In particular, a passport 60 as a reading target medium is used, and the reading surface 14 is formed with a size matching the target surface 61 of the passport 60. Thus, the form of the target surface 61 to be read, i.e., one of the two facing pages showing given information, e.g., the passport information 61*a*, matches the form of the reading surface 14. Thus, when the target surface 61 of the passport 60 is placed over the reading surface 14, with the boundary 63 being aligned parallel to the edge of the top surface 11*a*, the target surface 61 covers only the reading surface 14 and does not cover the end portion 15. Thus, while reading efficiency is ensured for the passport 60, operability of the operation part 42 and visibility of the display 43 are also reliably ensured.

Furthermore, the mode switch 42*a* and the scan switch 42*b* of the operation part 42 are constituted as touch switches. Therefore, compared to the case where these switches are constituted as push buttons or the like, steps or gaps are eliminated from the operation part, leading to easy maintenance of cleaning or the like.

Furthermore, there is provided the protective plate 16 for covering the reading surface 14 and the end portion 15. In addition, the mode switch 42*a* and the scan switch 42*b* of the operation part 42 are each provided with the substrate 42*c* in which the detection electrode 42*d* is formed to detect a touch via the protective plate 16. Furthermore, the extension segment 12*b* as a part of the housing 11 is interposed between the detection electrode 42*d* and the protective plate 16.

Thus, static resistance of the operation part 42 can be enhanced according to the thickness of the interposed extension segment 12*b*. In particular, even when the thickness of the extension segment 12*b* is reduced to maintain sensitivity of the operation part 42, static electrical charge or the like applied from the protective plate 16 side may easily spread to other parts, such as the body 12*a*, of the housing 11 via the extension segment 12*b*. Therefore, static resistance can be improved without impairing sensitivity of the operation part 42.

Figure 28:
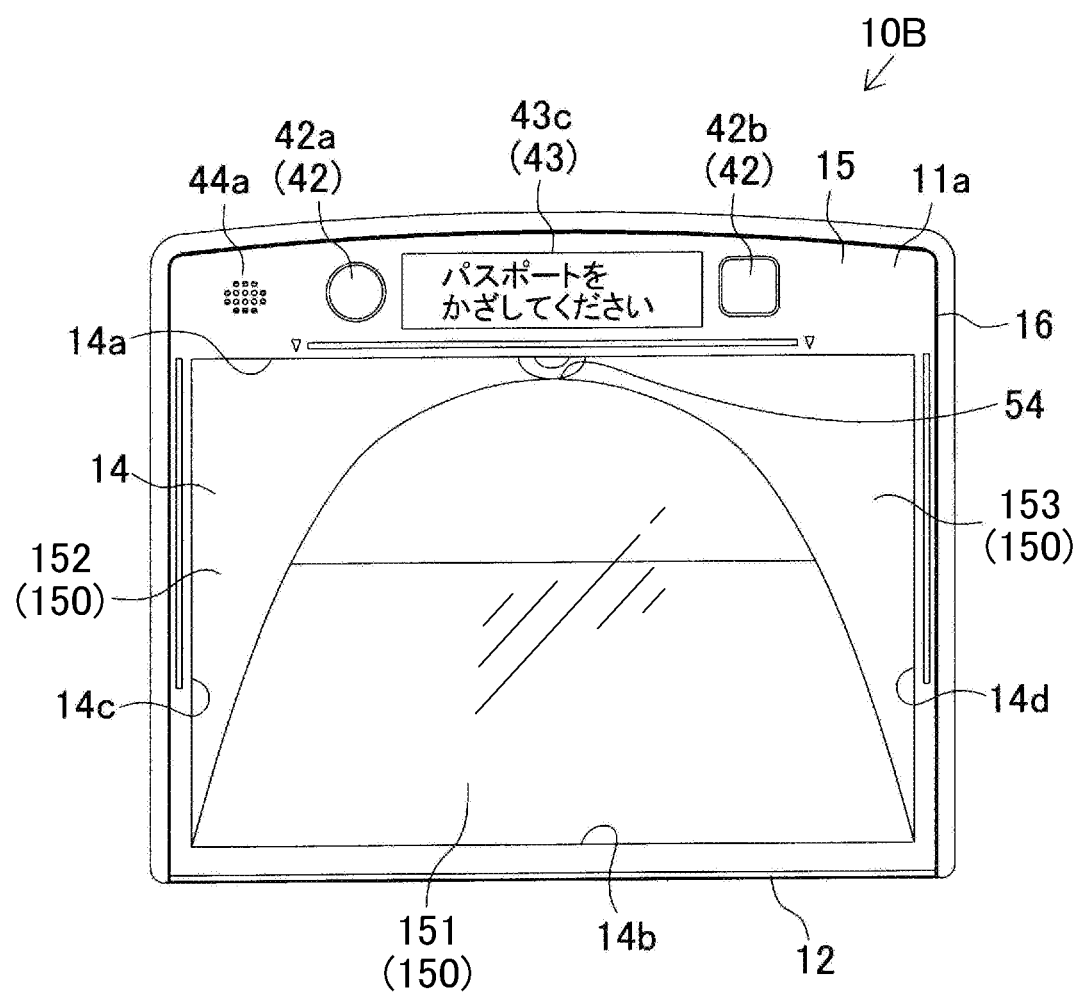
FIG. 28 is a plan view illustrating an optical information reader according to a modification of the eighth embodiment.

The present invention should not be construed as being limited to the embodiments described above. For example, the present invention may be embodied as follows. Specifically, in the above embodiments, the display 43 provided to the end portion 15 has been constituted as the mode display LED 43*a* or the reading confirmation display LED 43*b*. Alternatively, for example, the display 43 may be constituted as a liquid crystal display (LCD) 43*c* as shown in FIG. 28, to enable display of a switched mode or the result of reading performed by the reading part.

In all the embodiments and modifications thereof of the optical information reader of the present invention, the reading target has been a passport 60, an information code or the like. Alternatively, for example, the reading target may be optical information including other character information or the like. Furthermore, in the optical information reader of the present invention, the target to be stored is not limited to an image of the target surface 61 of the passport 60, an image of a driver's license or the like, but may be images of other target surfaces.

DESCRIPTION OF PARTIAL REFERENCE SIGNS

10, 10A, 10B . . . Optical information reader
11 . . . Housing
14 . . . Reading surface
16 . . . Protective plate
21 . . . Illuminant
23 . . . Imager
27 . . . Image former
40 . . . Control unit (reading part)
50, 150 . . . Reflective member
55 . . . Reflecting surface (predetermined reflecting surface)
60 . . . Passport (imaging target, reading target, reading target medium)
81 . . . Second illuminant
91 . . . First emitter
92 . . . Second emitter
93 . . . Light guide plate
96 . . . Groove
AR1 . . . First imaging region
AR2 . . . Second imaging region
Lf . . . Illumination light

What is claimed is:

1. An optical information reader comprising:
a housing provided with an optical reading window, the optical reading window serving as a reading surface on or over which an imaging target being optically read is placed outside the housing;
an illuminant arranged inside the housing;
a reflective member fixedly arranged and having a predetermined reflective surface reflecting illumination light emitted from the illuminant toward the reading surface;
an imager arranged inside the housing and configured to receive an image, through the reading surface, of the illumination light reflected by the imaging target on or over the reading surface outside the housing; and
an image former configured to guide the illumination light reflected by the imaging target toward an imaging region of the imager through a stationary spatial imaging region provided among the illuminant, the reflective member, and the reading surface, wherein
the spatial imaging region includes a first spatial imaging region and a second spatial imaging region, the first and second spatial imaging regions being stationary, the first spatial imaging region being provided between the image former and the reading surface and provided to enable the illumination light from the predetermined reflective surface of the reflective member to be reflected by the imaging target on or over the reading surface toward the image former, the second spatial imaging region being provided between the reading surface and the reflective member and provided to enable the illumination light from the illuminant to be transmitted from the predetermined reflective surface of the reflective member toward the reading surface, and the second spatial imaging region bending on the reading surface toward the imager and continuing to the first spatial imaging region;
the reflective member is arranged spatially outside the first spatial imaging region in the spatial imaging region;
the illuminant, the imager and the image former are arranged spatially outside the second spatial imaging region in the spatial imaging region; and
the illuminant emits the illumination light toward the predetermined reflecting surface of the reflective member across the first and second spatial imaging regions.

2. The optical information reader according to claim 1, wherein the illuminant emits the illumination light so as to minimize variation in illumination distribution on the predetermined reflecting surface.

3. The optical information reader according to claim 1, wherein:
an optically transparent plate is arranged so as to close at least a part of the reading surface.

4. The optical information reader according to claim 1, wherein the reading surface is provided with a locating member to which the imaging target is placed.

5. The optical information reader according to claim 4, wherein the locating member is provided integrally with the housing.

6. The optical information reader according to claim 1, wherein the illuminant is a surface illuminant.

7. The optical information reader according to claim 1, wherein a diffusion member is arranged between the illuminant and the reflective member to diffuse the illumination light.

8. The optical information reader according to claim 1, wherein asperities are provided to at least the predetermined reflecting surface of the reflective member.

9. The optical information reader according to claim 1, wherein the reflective member is formed so that at least the predetermined reflecting surface is curved.

10. The optical information reader according to claim 1, wherein the illuminant emits the illumination light so that illumination distribution on the predetermined reflecting surface gradually varies according to a distance from the illuminant.

11. The optical information reader according to claim 1, comprising a lens that directs a part of the illumination light from the illuminant toward a predetermined range of the reading surface without intervention of the reflective member.

12. The optical information reader according to claim 1, comprising a second illuminant that emits second illumination light toward a predetermined range of the reading surface.

13. The optical information reader according to claim 1, wherein:
the illuminant includes a first emitter, a second emitter and a light guide plate arranged between the first emitter and the second emitter, the light guide plate having a first side face on which light from the first emitter is incident and a second side face which faces the first side face and on which light from the second emitter is incident;
the light guide plate has a plurality of grooves inside to reflect light that is incident on the first side face and the second side face toward an emission surface; and
the plurality of grooves are each asymmetrically formed so that a surface thereof facing the first side face has a shape different from a shape of a surface thereof facing the second side face.

14. The optical information reader according to claim 1, wherein:
the illuminant includes an emitter and a light guide plate having a first side face on which light from the emitter is incident;
the light guide plate has a plurality of grooves inside to reflect light that is incident on the first side face toward an emission surface; and
the plurality of grooves are each asymmetrically formed so that a surface of each groove facing the first side face has a shape different from a shape of a surface of the groove facing a second side face, the second side face being a surface of the light guide plate facing away from the first side face.

15. The optical information reader according to claim 14, wherein the second side face is provided with a reflective member.

16. The optical information reader according to claim 1, comprising:
an externally operable operation part;
a reading part reading information of the imaging target from a result of imaging performed by the imager; and
a display capable of displaying a result of reading performed by the reading part, wherein
the housing has a top surface on which the reading surface in a rectangular shape is formed;
the top surface is configured to include the reading surface and a surface portion at an end of the top surface, the surface portion being continuous to one side of the reading surface; and
the operation part and the display are arranged on the surface portion at an edge.

17. The optical information reader according to claim 16, wherein the operation part is constituted as a touch switch.

18. The optical information reader according to claim 17, wherein:
the optical information reader comprises a protective plate covering the reading surface and the surface portion at an end;
the operation part includes a substrate on which a detection electrode is formed to detect a touch via the protective plate; and
a part of the housing is arranged so as to be interposed between the detection electrode and the protective plate.

19. The optical information reader according to claim 1, wherein the illuminant is arranged fixedly in the housing and is either a surface illuminant or a combination of point light sources which compose an actual surface illuminant.

20. The optical information reader according to claim 19, wherein the reflective member is arranged to be oblique to both the illuminant and the reading surface.

21. An optical information reader comprising:
a housing having a top surface located at a top in a height direction, a rectangular reading surface being formed in the top surface, the rectangular reading surface being light-transmissive and having four sides which form a rectangular shape, a reading target being held on or over the rectangular reading surface;
an imager arranged inside the housing to capture an image of a target surface of the reading target;
a reading part reading given information on the target surface, based on a result of imaging performed by the imager;
an externally operable operation part; and
a display displaying a result of reading performed by the reading part, wherein
the top surface is constituted by the reading surface and a surface portion at an end of the reading surface, the surface portion being continuous to one side of the four sides of the reading surface in the height direction of the housing; and
the operation part and the display are is-arranged on the surface portion.

22. The optical information reader according to claim 21, wherein:
the reading target is a passport; and the reading surface is formed with a size matching that of the target surface of the passport.

23. The optical information reader according to claim 21, wherein the operation part is constituted as a touch switch.

24. The optical information reader according to claim 23, wherein
the optical information reader comprises a protective plate covering a reading surface on which the reading surface is formed, and the surface portion at an end; and
the operation part includes a substrate on which a detection electrode is formed to detect a touch via the protective plate; and
the housing has a part which is arranged so as to be interposed between the detection electrode and the protective plate.

* * * * *